United States Patent
Major et al.

[11] Patent Number: 6,130,147
[45] Date of Patent: *Oct. 10, 2000

[54] METHODS FOR FORMING GROUP III-V ARSENIDE-NITRIDE SEMICONDUCTOR MATERIALS

[75] Inventors: Jo S. Major, San Jose; David F. Welch, Menlo Park; Donald R. Scifres, San Jose, all of Calif.

[73] Assignee: SDL, Inc., San Jose, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/820,727

[22] Filed: Mar. 18, 1997

Related U.S. Application Data

[60] Division of application No. 08/724,321, Oct. 1, 1996, Pat. No. 5,689,123, which is a continuation-in-part of application No. 08/224,027, Apr. 7, 1994, abandoned.

[51] Int. Cl.$^7$ ................................................ H01L 21/28
[52] U.S. Cl. ........................ 438/604; 438/47; 438/48; 438/606
[58] Field of Search ............... 438/29, 604, 606, 438/47, 48; 257/190; 372/45

[56] References Cited

U.S. PATENT DOCUMENTS

| | | | |
|---|---|---|---|
| 4,058,430 | 11/1977 | Suntola et al. | 438/478 |
| 4,062,706 | 12/1977 | Ruehrwein | 148/175 |
| 4,614,961 | 9/1986 | Khan et al. | 357/30 |
| 4,862,471 | 8/1989 | Pankove | 372/45 |
| 5,005,057 | 4/1991 | Izumiya et al. | 257/13 |
| 5,006,908 | 4/1991 | Matsuoka et al. | 257/76 |
| 5,042,043 | 8/1991 | Hatano et al. | 372/45 |
| 5,076,860 | 12/1991 | Ohba et al. | 148/33.1 |
| 5,082,798 | 1/1992 | Arimoto | 437/108 |
| 5,122,845 | 6/1992 | Manabe et al. | 357/17 |
| 5,146,465 | 9/1992 | Khan et al. | 372/45 |
| 5,173,751 | 12/1992 | Ota et al. | 257/76 |
| 5,182,670 | 1/1993 | Khan et al. | 359/359 |
| 5,192,987 | 3/1993 | Khan et al. | 257/183.1 |
| 5,273,933 | 12/1993 | Hatano et al. | 117/89 |
| 5,274,251 | 12/1993 | Ota et al. | 257/78 |
| 5,383,211 | 1/1995 | Van de Walle et al. | 372/43 |
| 5,385,862 | 1/1995 | Moustakas | 117/108 |
| 5,449,930 | 9/1995 | Zhou | 257/197 |
| 5,639,139 | 6/1997 | Nishizawa et al. | 117/89 |
| 5,932,896 | 8/1999 | Sugiura et al. | 257/94 |
| 5,937,274 | 8/1999 | Kondow et al. | 438/47 |

FOREIGN PATENT DOCUMENTS

| | | |
|---|---|---|
| 1-025590 | 1/1989 | Japan. |
| 3-080198 | 4/1991 | Japan. |

OTHER PUBLICATIONS

S. Miyoshi et al., "Metalorganic Vapor Phase Epitaxy of $GaP_{1-x}N_x$ alloys on GaP", Appl. Phys. Lett., 63(25), Dec. 20, 1993, pp. 3506–3508.

(List continued on next page.)

*Primary Examiner*—Carl Whitehead, Jr.
*Assistant Examiner*—Maria Guerrero
*Attorney, Agent, or Firm*—W. Douglas Carothers, Jr.

[57] ABSTRACT

Methods are disclosed for forming Group III—arsenide-nitride semiconductor materials. Group III elements are combined with group V elements, including at least nitrogen and arsenic, in concentrations chosen to lattice match commercially available crystalline substrates. Epitaxial growth of these III–V crystals results in direct bandgap materials, which can be used in applications such as light emitting diodes and lasers. Varying the concentrations of the elements in the III–V crystals varies the bandgaps, such that materials emitting light spanning the visible spectra, as well as mid-IR and near-UV emitters, can be created. Conversely, such material can be used to create devices that acquire light and convert the light to electricity, for applications such as full color photodetectors and solar energy collectors. The growth of the III–V crystals can be accomplished by growing thin layers of elements or compounds in sequences that result in the overall lattice match and bandgap desired.

34 Claims, 8 Drawing Sheets

OTHER PUBLICATIONS

Robert M. Fletcher et al., "High–Efficiency Aluminum Indium Gallium Phosphide Light–Emitting Diodes" Hewlett–Packard Jrnl., Aug. 1993, pp. 6–14.

X. Liu et al., "Band Gap Bowing in $GaP_{1-x}N_x$ Alloys", Appl. Phys. Lett.,63(2), Jul. 12, 1993, pp. 208–221.

J.N. Baillargeon, "Luminescencequenching and the formation of the $Gap_{1-x}N_x$ alloy in GaP with IncreasingNitrogen Content", Appl. Phys. Lett.60 (20), May 18, 1992, pp. 2540–2542.

M.A. Haase et al., "Blue–green Laser Diodes", Appl. Phys. Lett.,59 (11),Sep. 9, 1991, pp. 1272–1273.

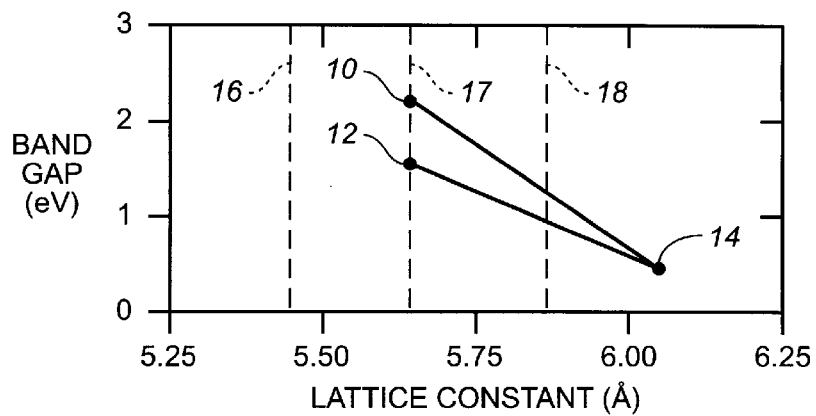
FIG._1
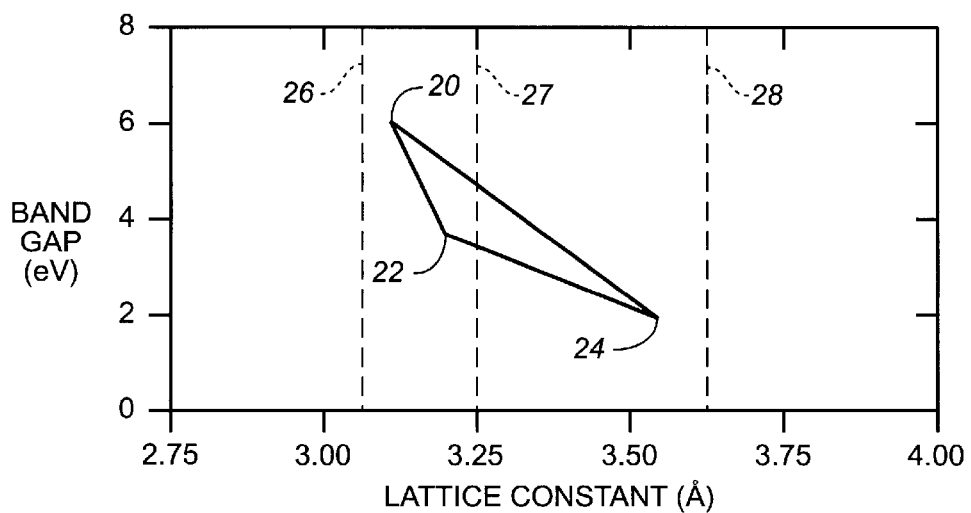
FIG._2
| | GROUP III | | | | GROUP V | | | |
|---|---|---|---|---|---|---|---|---|
| ELEMENT | B | Al | Ga | In | N | P | As | Sb |
| RADIUS (Å) | 0.88 | 1.26 | 1.26 | 1.44 | 0.70 | 1.10 | 1.18 | 1.36 |
FIG._3

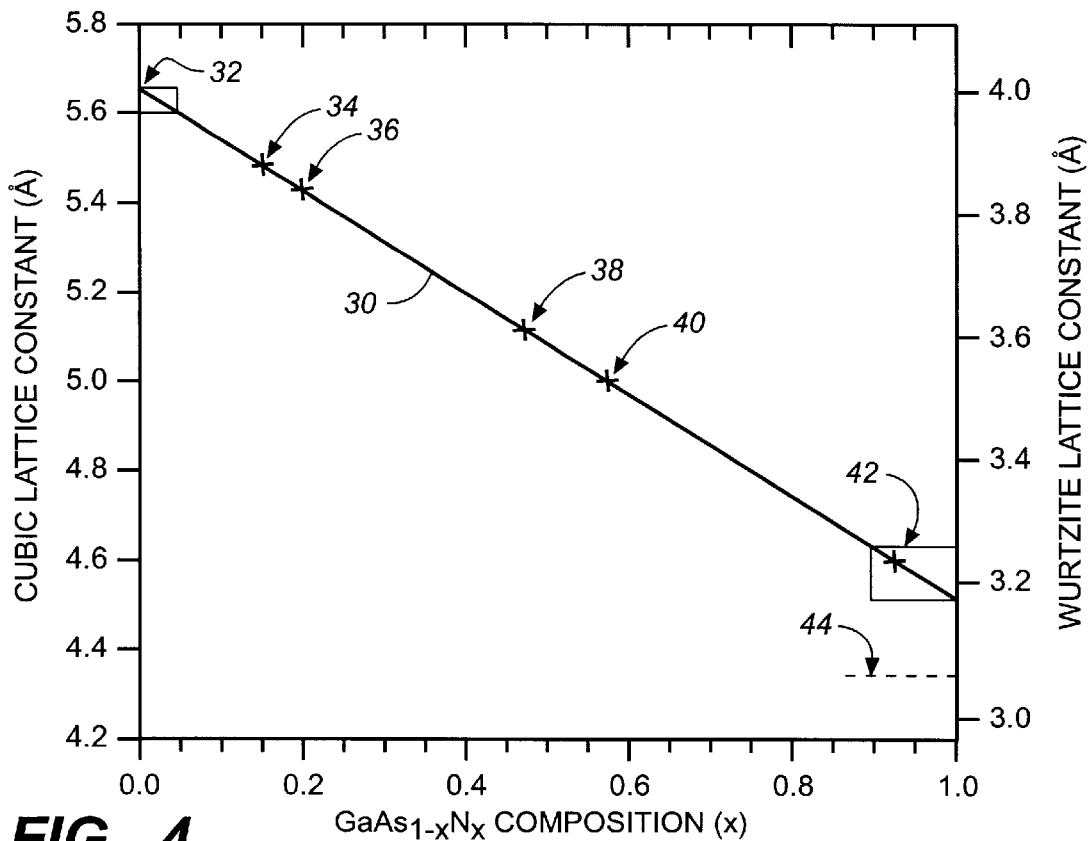
FIG._4
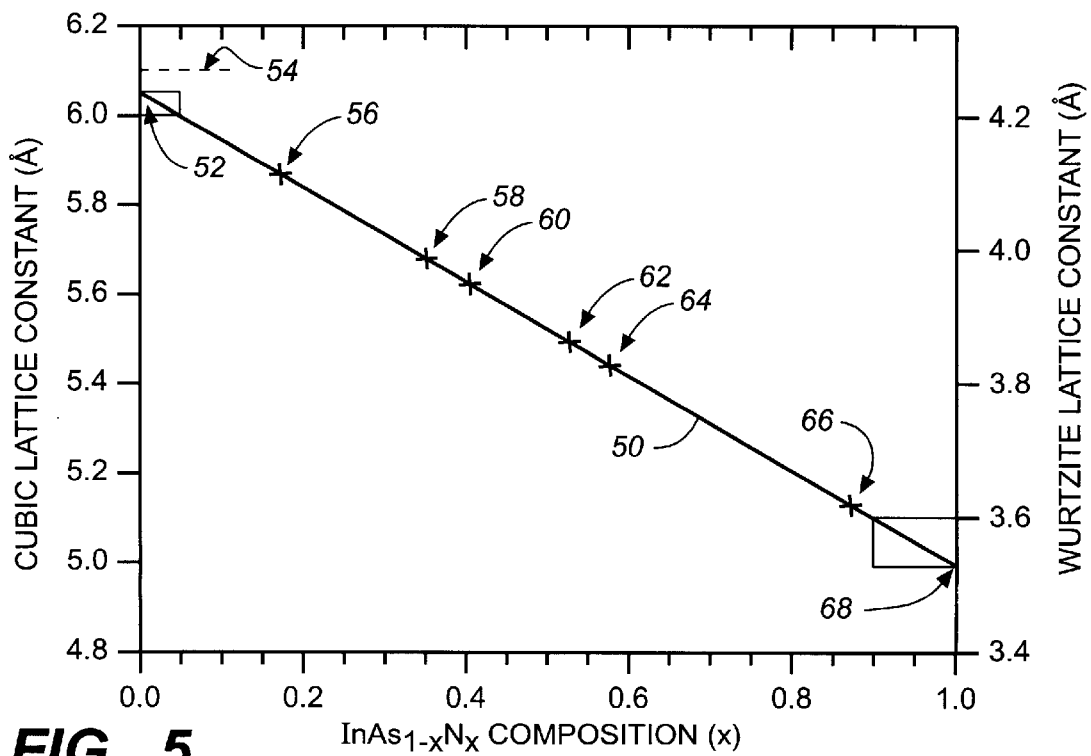
FIG._5

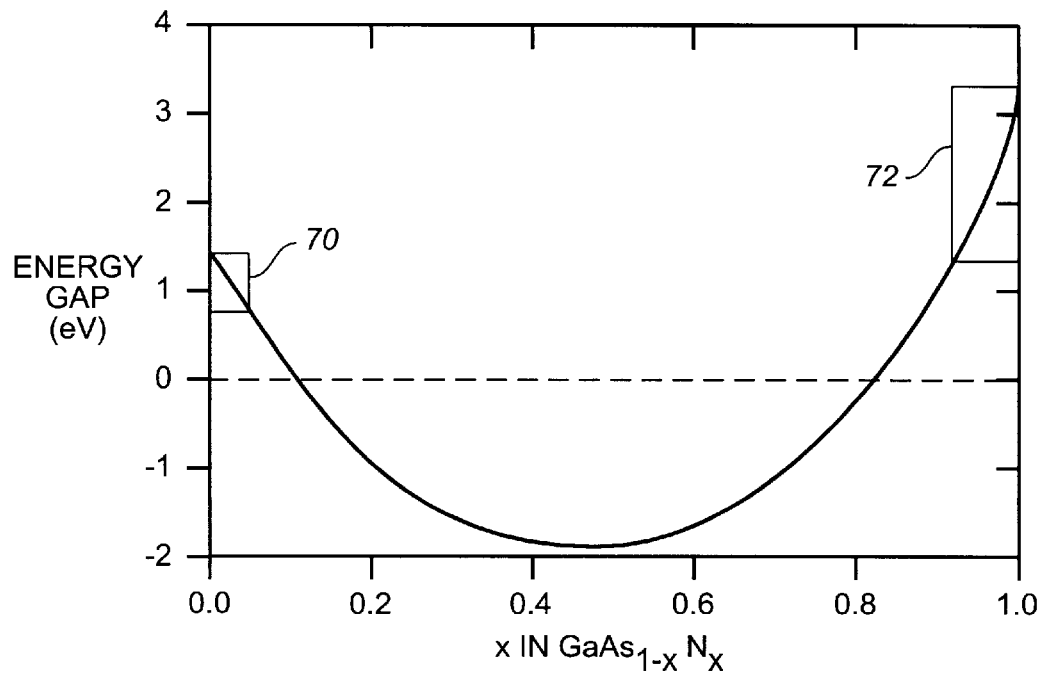
FIG._6
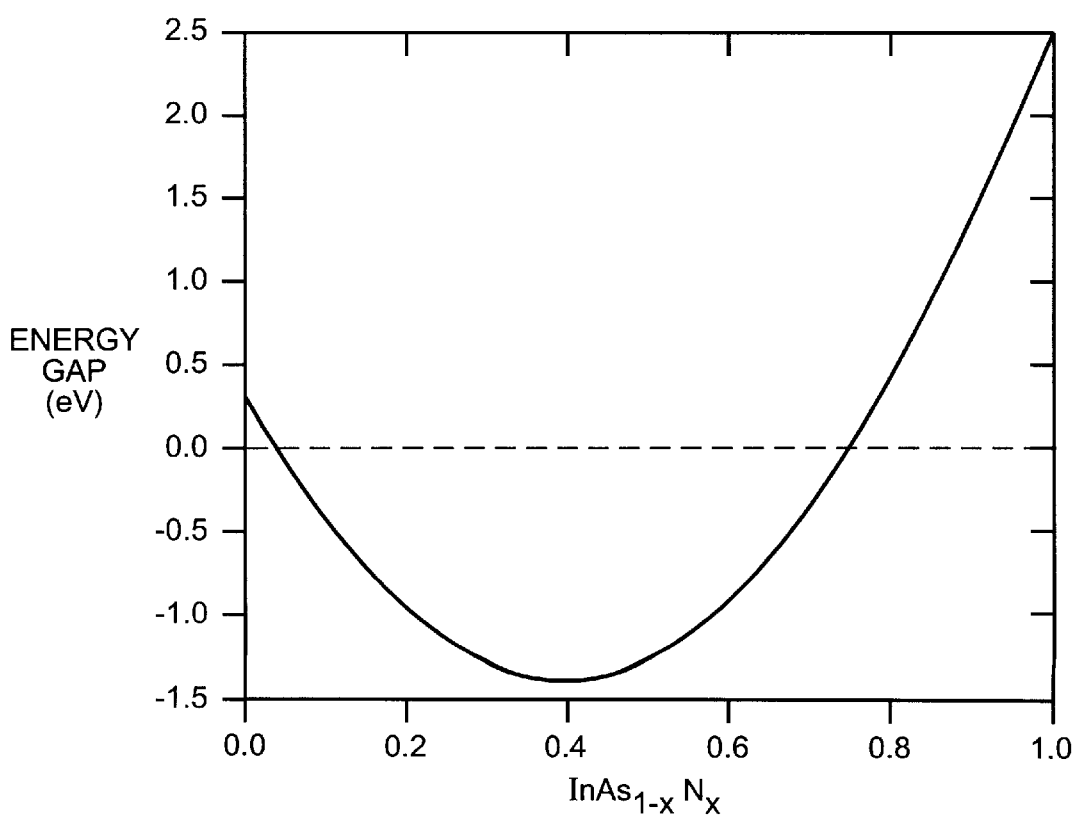
FIG._7

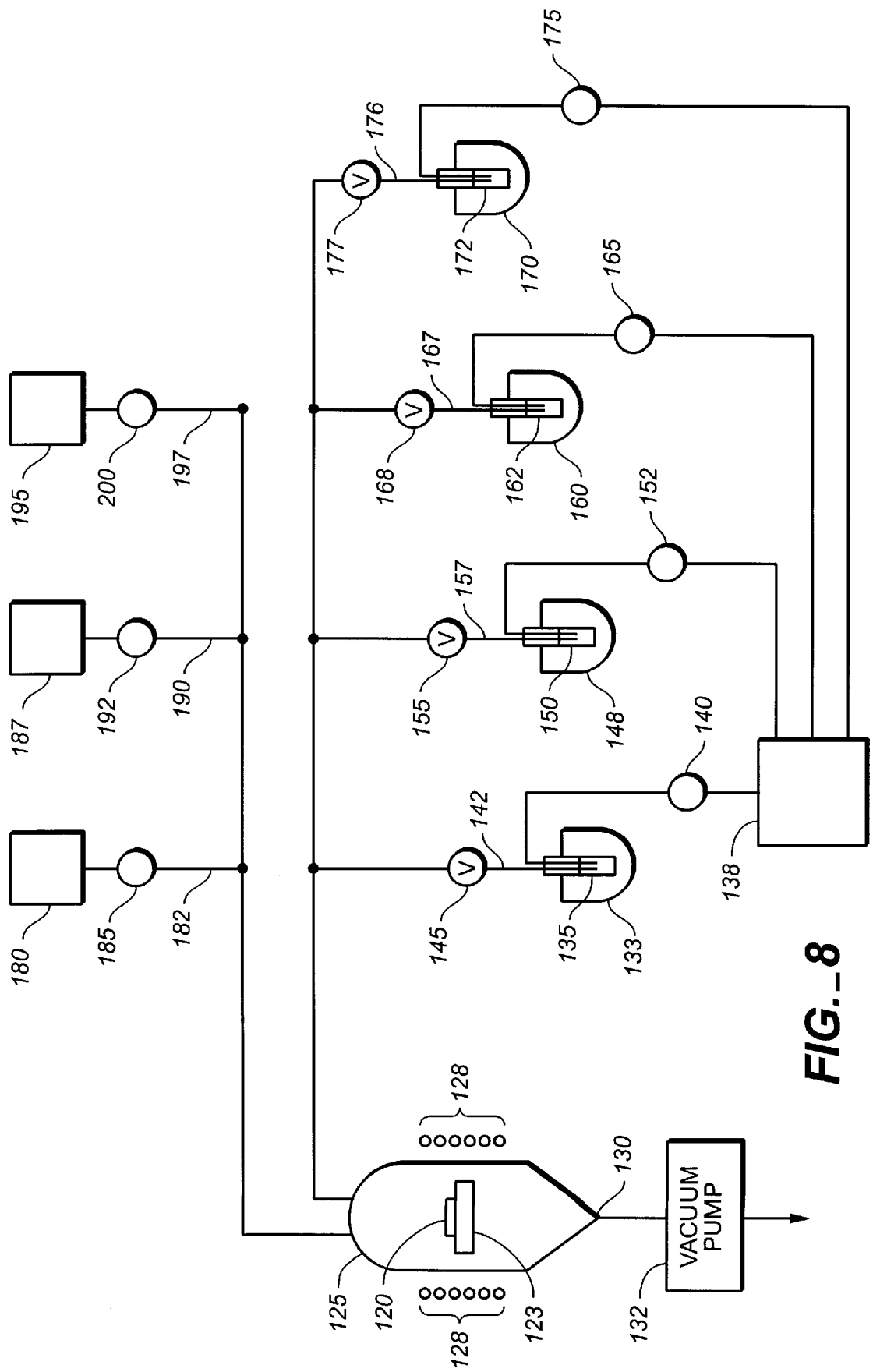
FIG._8

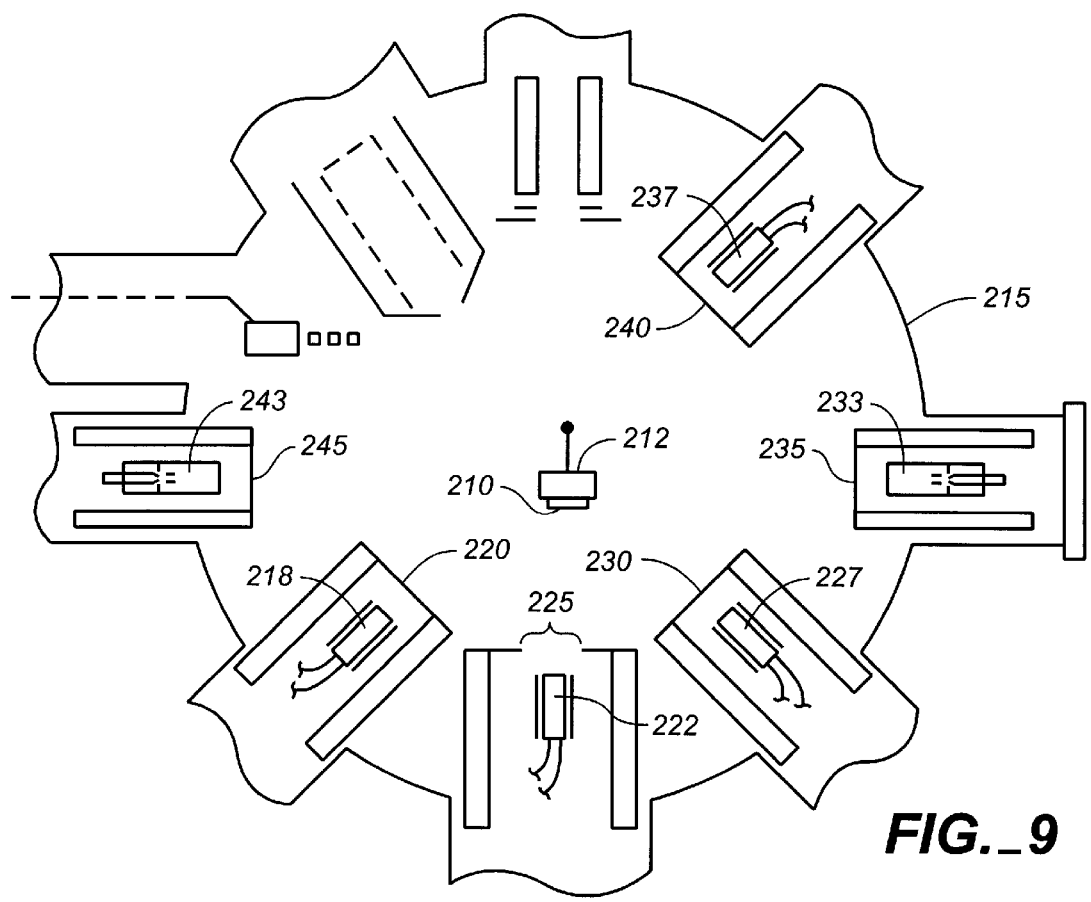
FIG._9

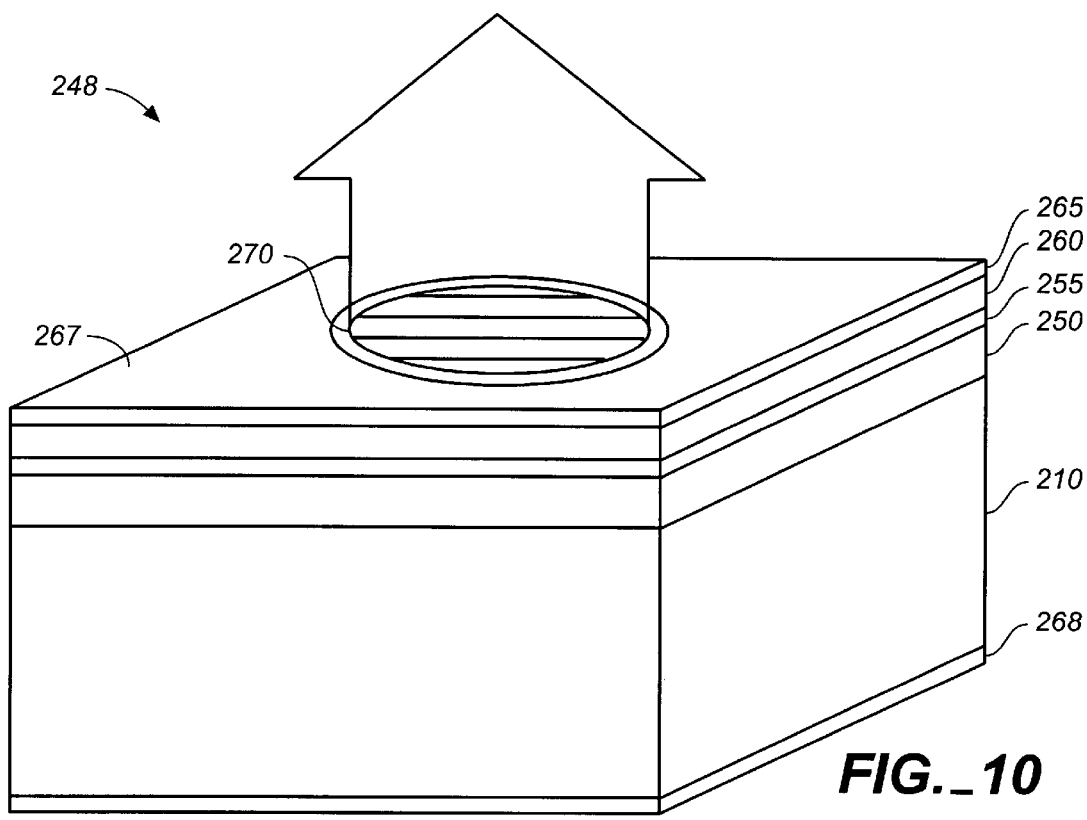
FIG._10
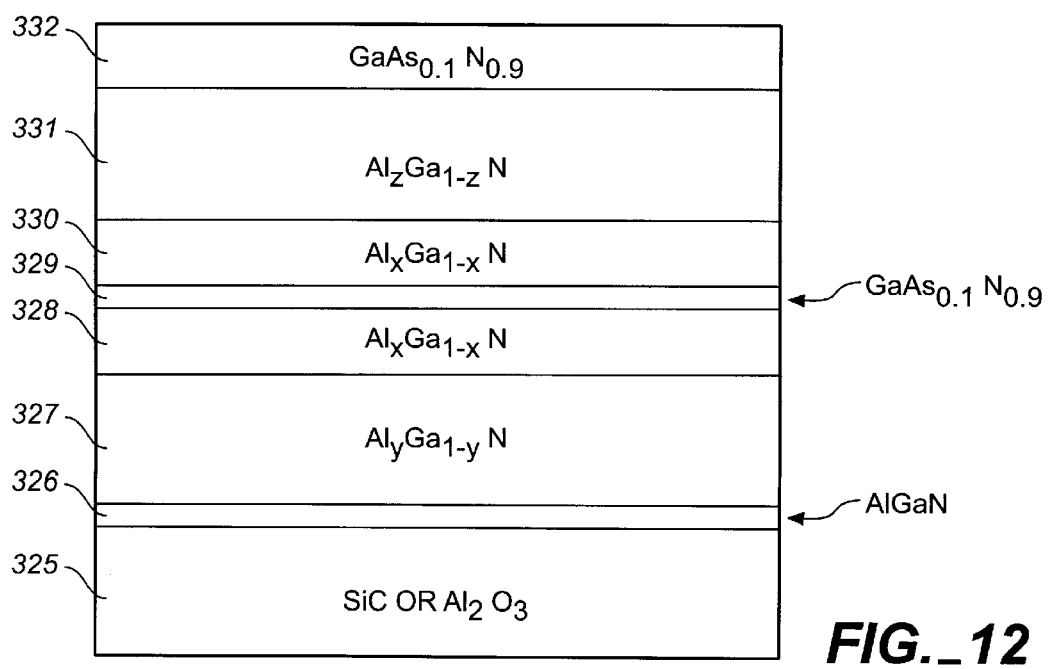
FIG._12

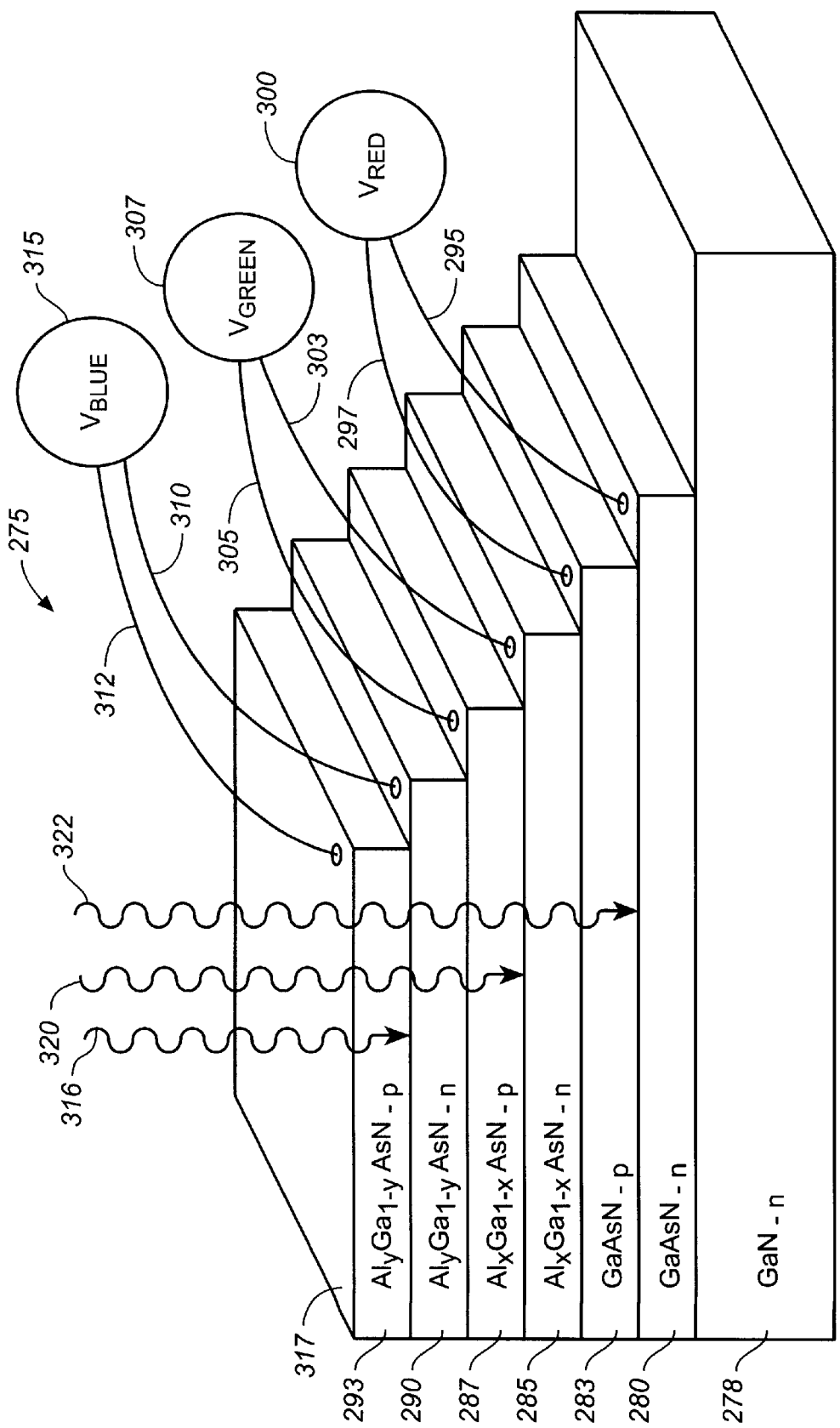
FIG._11

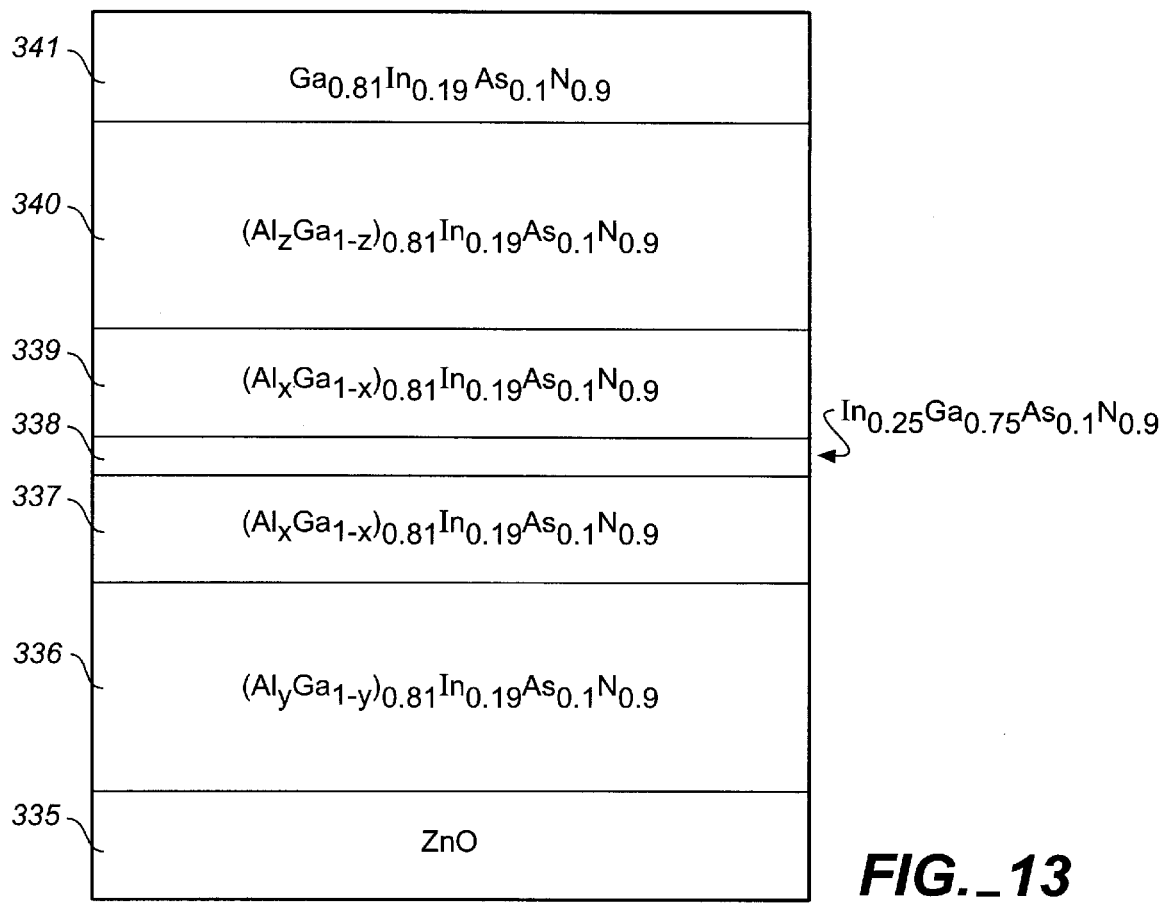
FIG._13
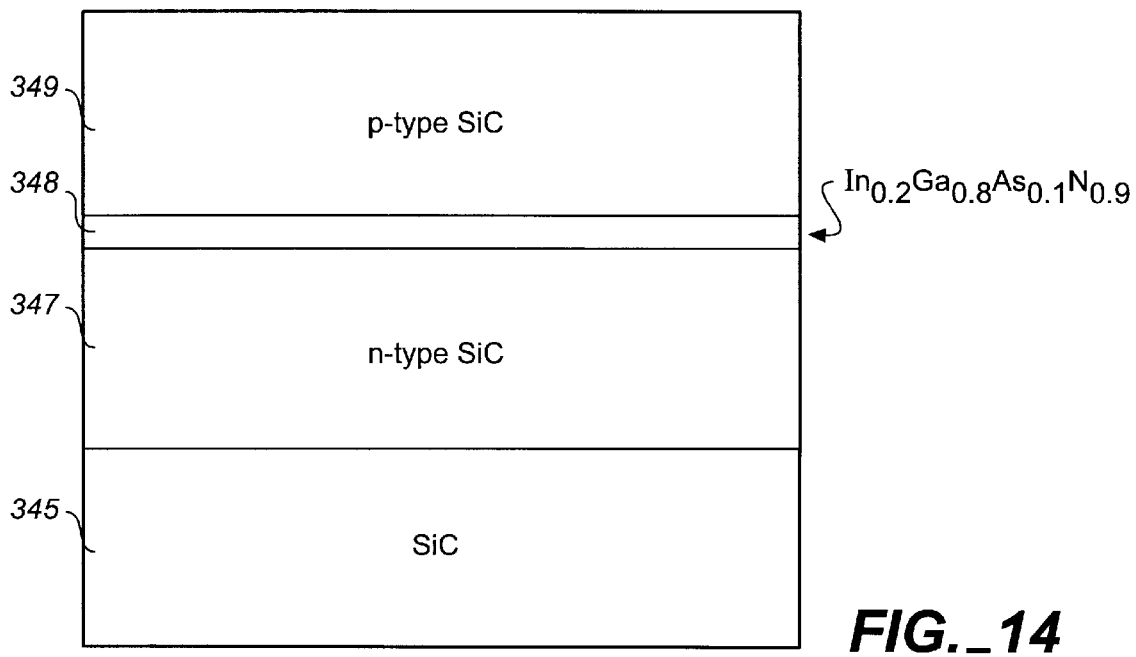
FIG._14

METHODS FOR FORMING GROUP III-V ARSENIDE-NITRIDE SEMICONDUCTOR MATERIALS

CROSS-REFERENCE TO RELATED APPLICATION

This application is a division of application Ser. No. 08/724,321 filed Oct. 1, 1996 which application is now: U.S. Pat. No. 5,689,123 which is a continuation-in-part of U.S. patent application Ser. No. 08/224,027, filed Apr. 7, 1994, now abandoned.

STATEMENT AS TO RIGHTS TO INVENTIONS MADE UNDER FEDERALLY-SPONSORED RESEARCH AND DEVELOPMENT

This invention was made with government support under Contract No. NAS5-32442 awarded by the National Aeronautics and Space Administration (NASA) and under Contract No. N00014-93-C-0130 awarded by the Department of the Navy. The government has certain rights in the invention.

TECHNICAL FIELD

The present invention relates to methods for forming monocrystalline III-V arsenide-nitride semiconductor materials, especially those materials having a high bandgap (greater than 2.0 eV). More particularly it relates to direct bandgap light emitting materials, preferably those with cubic crystal lattices, which can be used to make devices such as semiconductor lasers that emit light with frequencies in a range that more than span the visible spectra.

BACKGROUND ART

Semiconductor lasers that emit light in the long wavelength visible (red) and near infrared spectra have been known for many years. To date, however, it has been difficult to produce such lasers that emit light in the short wavelength, blue region of the visible spectra. A wide variety of applications await such "blue" lasers, should they become commercially available.

Certain II-VI semiconductor compounds such as zinc selenide sulphide (ZnSeS) have been considered promising candidates for blue lasers. In an article entitled "Blue-green laser diodes," *Appl. Phys. Lett.*, v. 59, Sep. 9, 1991, M. A. Haase et al. describe achieving lasing action at a wavelength of 490 nm with a ZnSe based structure under pulsed current injection at 77 K. More recent advances in this material system using a remote plasma source for the introduction of radical nitrogen (N) atoms have resulted in the demonstration of pulsed laser operation at room temperature at a wavelength of 480 nm.

The ZnSeS based structures have several limitations, however, due to conduction band alignment and the activation energy of defects. The confinement energy of the cladding layers limits efficient operation of the ZnSeS system to a wavelength of 530 nm, as the electron confinement is too small for efficient operation of laser diodes at 480 nm or shorter wavelengths. The low activation energy of defects in the crystal lattice of such a material limits the processing and growth temperature of the structure to no more than a few hundred degrees Celsius.

The ZnSeS materials are further complicated by the problems associated with growth on a gallium arsenide (GaAs) substrate. The interface between the ZnSeS and GaAs results in a cross doping of the compounds. The Ga and As act as dopants in the ZnSeS and the Zn, Se and S act as dopants in the GaAs. As a result the interface between the two compounds becomes quite resistive. Laser diodes fabricated with this interface require operating voltages in excess of 20 V. The heat dissipated from this is also high, preventing continuous wave (CW) operation at room temperature.

An alternative to the II-VI compounds for blue light emission are the III-V semiconductor compounds, such as AlGaInN. The advantages of the III-V material systems are several. First, they include materials having large direct bandgaps ranging from 2 eV to 6 eV. Second, large energy differences between the valleys of the lowest direct bandgaps and those of the lowest indirect bandgaps exist. Third, electrons and holes can be satisfactorily confined in heterostructures, including quantum well structures, due to large confinement energies. Fourth, production of these materials is compatible with metal organic chemical vapor deposition (MOCVD) growth reactors. Fifth, the materials typically have low resistance to n-type and p-type doping. Finally, the III-V materials can avoid the cross doping and defect creation and propagation problems that plague the II-VI materials.

AlGaInN materials have so far been grown only on mismatched substrates such as Si, Sic, single crystal $Al_2O_3$ and MgO. Mismatched crystal lattices tend to have defects that absorb light, lowering the efficiency of light generation and reducing lasing potential. Defects also tend to propagate through crystals, lowering the useful life of the crystals.

Another difficulty is that AlGaInN type materials typically have a native wurtzite, or generally hexagonal, crystal lattice, which has few convenient cleavage planes to form mirrored facets for Fabry-Perot reflection and which cannot be easily grown to exactly layered depths for quantum wells or other cladding confined structures. For laser diodes, it is desirable that the heterostructure material have a generally cubic zincblende crystal lattice. While in AlGaInN materials the cubic structure is metastable at typical production temperatures, and thus not impossible to form in principle, to actually produce such a cubic crystal lattice material by epitaxial growth techniques appears to require a substrate that is not only lattice matched to the AlGaInN type material but also has a cubic lattice that induces the growth of a cubic substrate lattice of the AlGaInN type material layers. Substrates which have commonly been used for group III-V high bandgap semiconductors, such as basal plane (0001) sapphire ($Al_2O_3$) and α-SiC, have the disadvantage of producing the less desirable wurtzite crystal lattice structure.

In U.S. Pat No. 5,146,465, Kahn et al. describe growing layers of AlGaN with alternating concentrations of Al and Ga on an AlN buffer layer which, in turn, was grown on an $Al_2O_3$ substrate. Kahn et al. appear to overcome some of the difficulties inherent in the wurtzite lattice by polishing walls of the device and adding mirrors. However, cleaved facets, when available, are inherently better mirror surfaces than etched or polished surfaces because of their lower defect density. In U.S. Pat. Nos. 5,173,751 and 5,274,251, Ota et al. take advantage of the lattice constant of α-ZnO, which falls between that of several III-V nitride materials, allowing mixing of those materials in proportions calculated to match the substrate lattice of ZnO, to form AlGaInN or AlGaNP layers. The resultant crystal lattice appears to be wurtzite in form.

In U.S. Pat No. 4,862,471, Pankove describes the growth on a gallium phosphide (GaP) substrate of gallium nitride (GaN). Indium nitride (InN) or aluminum nitride (AlN)

layers are similarly grown to form a quantum well light emitting device. Similarly, U.S. Pat. No. 5,076,860 to Ohba et al. teaches a compound semiconductor material of GaAlBNP with a zincblende (cubic) crystal lattice, grown on a GaP substrate. Ohba et al. describe several different materials, including a GaAlN semiconductor grown on a BP substrate and the growth of group III–V materials having ordered bonds but non-lattice matched crystals. U.S. Pat. No. 5,042,043 to Hatano et al. describes a semiconductor laser formed from alternately stacking BP and GaAlN layers to form $Ga_xAl_yB_{1-x-y}N_zP_{1-z}$ material on a GaP substrate. In all of these cases, the use of GaP as a substrate results in a severe lattice mismatch with the nitride material layers (about 20% mismatch for GaN). In an article entitled "High-Efficiency Aluminum Indium Gallium Phosphide Light-Emitting Diodes," *Hewlett-Packard Journal,* August 1993, pp. 6–14, R. M. Fletcher et al. describe gallium arsenide phosphide doped with nitrogen (GaAsP:N) and gallium phosphide doped with nitrogen (GaP:N).

In an article entitled "Luminescence quenching and the formation of the $GaP_{1-x}N_x$ alloy in GaP with increasing nitrogen content," *Applied Physics Letters,* Vol. 60, No. 20, May 18, 1992, pp. 2540–2542, J. N. Baillargeon et al. teach N doping in GaP of up to 7.6% using molecular beam epitaxy (MBE), and note that increasing nitrogen content tends to shift emission spectra lower above a certain nitrogen concentration. Similarly, X. Liu et al. describe observing a red shift in emission spectra from GaP:N as nitrogen (N) concentration is increased in "Band gap Bowing in $GaP_{1-x}N_x$ alloys," *Applied Physics Letters,* Vol. 63, No. 2, Jul. 12, 1993, pp. 206–210. Difficulties are encountered when mixed compounds having significant amounts of both nitrogen and other group V elements are attempted. Miyoshi et al. describe a miscibility gap for growth of $GaP_{1-x}N_x$ for $x \geq 0.04$ in an article entitled "Metalorganic vapor phase epitaxy of $GaP_{1-x}N_x$ alloys on GaP," *Applied Physics Letters,* Vol. 63, No. 25, Dec. 20, 1993, pp. 3506–3508.

Of primary concern to reliable visible laser diode operation is the optimization of the substrate and growth buffer layers. To form a semiconductor material having desirable lasing properties, it is advantageous to grow such a material on a lattice matched substrate in order to avoid the promulgation of defects that absorb light. It is also desirable, whenever possible, that the substrate promote growth in the semiconductor material of a cubic crystal lattice that facilitates the relatively easy formation of cleaved reflective facets for defining resonant laser cavities.

DISCLOSURE OF THE INVENTION

The present invention involves formation of monocrystalline III–V compound semiconductor materials having at least nitrogen and arsenic at group V lattice sites of the crystal material. Other group V elements, such as phosphorus and antimony, can also be present at group V lattice sites in addition to the nitrogen and arsenic. The group III atomic species can be any combination of boron, aluminum, gallium and indium.

The exact composition of a particular material to be produced, that is, the relative concentration of each of the group III and group V elements in the III–V compound, is generally selected so as to substantially lattice match with the selected substrate's growing surface. Some lattice strain due to lattice mismatch greater that 1% can be accommodated provided the mis-matched layer is sufficiently thin to avoid formation of lattice defects. In addition, for light emitting devices, such as laser diodes and LEDs, the desired emission wavelength determines the required semiconductor bandgap for the material and hence plays a major role in the choice of material composition and of a suitable substrate. For emission wavelengths shorter than about 620 nm, a bandgap greater the 2 eV is required. The III–V compound arsenide-nitride materials of the present invention are characterized by a large bandgap bowing parameter which must be taken into account when matching up the desired semiconductor bandgap with a possible material composition. $GaAs_xN_{1-x}$ material, where $x \leq 0.10$, has a bandgap greater than 2.0 eV. Laser diodes further require that the selected material be a direct bandgap material, that is, one where the energy of the lowest direct bandgap is below that of the lowest indirect bandgap, while LEDs are capable of operating using either direct or indirect bandgap materials. The $GaAs_xN_{1-x}$ material noted above is a direct bandgap material. The addition of other group III and group V elements, such as boron, aluminum, indium, phosphorus and indium, to the basic GaAsN composition allows somewhat independent adjustment of the lattice constant and bandgap, allowing different materials with different emission wavelengths to be lattice matched to the same substrate. For LIDAR systems, laser diodes using strained $InGaAs_{1-y}N_y$ active regions, where $y \leq 0.04$, can produce light emissions in the 2.0 μm to 2.5 μm range. It is also possible to produce electronic devices, such as transistors, which are capable of high temperature operation, using the high bandgap semiconductor material of the present invention.

The monocrystalline material of the present invention if formed by epitaxial growth on a monocrystalline substrate. Depending on the choice of substrate material and the orientation of the substrate's crystal lattice with respect to the substrate's surface, that is, the choice of crystal lattice plane for the growing surface, the resulting III–V compound arsenide-nitride material layers may have either a cubic zincblende crystal structure or a hexagonal wurtzite crystal structure. InGaAlAs materials have a native zincblende structure, but with the appropriate choice of substrate can be induced to grow in the metastable wurtzite structure. InGaAsAlN materials, on the other hand, have a native wurtzite structure, but with the appropriate choice of substrate can be induced to grow in the metastable zincblende structure. Substrates can be selected from the group consisting of $Al_2O_3$ (sapphire) using either basal plane or r-plane growing surfaces, diamond, Si, Ge, SiC in both wurtzite ($\alpha$) and zincblende ($\beta$) forms, InN, GaP, GaAsP, GaAs, InP, ZnO, ZnS, and ZnSe.

The arsenide-nitride materials of the present invention generally favor growth of cubic zincblende crystal structures when arsenic is the majority component in the group V lattice sites, up to about 4 or 5 percent nitrogen and favor growth of hexagonal wurtzite crystal structures when nitrogen is the majority component in the group V lattice sites, up to about 20 percent arsenic. When growth techniques, such as metal-organic chemical vapor deposition (MOCVD), are used to attempt growth of material with between 5 and 90 percent nitrogen, mixed polycrystalline layers with both zincblende and wurtzite crystals result. This immiscible region for the arsenide-nitride material of the present invention necessitates the use of growth techniques further away from thermodynamic equilibrium, such as atomic layer epitaxy, to obtain defect-free monocrystalline material with the required composition.

It has been found that lowering the growth rate of the AlGaAsN semiconductor material allows a greater concentration of N to be incorporated in the crystal. It is possible to increase the availability of N for incorporation by epitaxial growth using low-pressure metal organic vapor deposition (LP-MOCVD) utilizing N sources including hydrazine, phenol-hydrazine and metal-organic N sources. Ammonia ($NH_3$) may be employed as an N source with catalysts such as arsine and phosphine used to increase the cracking efficiency of $NH_3$. Alternatively, the N source can be pre-cracked. For example, in molecular beam epitaxy (MBE) an electron cyclotron resonator can be used to crack the $NH_3$ molecule, resulting in a radical N. Plasma deposition systems can also be used to increase the cracking efficiencies of $NH_3$.

It is possible to obtain the correct concentration of N relative to As by atomic layer epitaxy, a sequenced layering technique in which the growth monolayers containing N is interspersed with the growth of other monolayers containing As. The monolayers are thin enough to avoid defects due to mismatched lattices, as differing lattice constants between the monolayers tend to compensate for each other to produce a desired lattice match. For instance, five monolayers of GaAs can be grown for every monolayer of GaN, resulting in an overall group V lattice site N concentration of approximately 17% and As concentration of about 83%. It is similarly possible to provide the relative concentrations of Al compared to Ga with such layering. Thus, for example, having two monolayers of Ga interspersed with four layers of Al results in a Ga concentration of approximately 33% and an Al concentration of approximately 67%. This process can be continued to form, for example, alternating quarter wavelength (115 nm) optically reflective layers or quantum wells formed of layers on the order of the electron wavelengths (5 nm) and other heterostructure lasing devices for which the exact depth of the layers is important.

The previous discussion has centered upon the growth techniques for alloys with N as the minority element on the Group V sublattice. Similar growth technology may be employed to grow alloys where N is the majority element on the Group V sublattice. However, the growth conditions themselves must be changed. Experiments have shown that the solubility of As in GaN is significantly greater than the solubility of N in GaAs; transmission electron microscopy has shown greater than 10% incorporation of As in GaN grown by conventional LP-MOCVD. Thus, for alloys with As content equal to or less than 10% MOCVD, either atmospheric or low-pressure, growth can be used with the ratio between N and As in the gas phase adjusted to provide the required As content. For alloy compositions greater than 10% As, multiple layer growth, as previously outlined, will be employed. For example, the layer structure required for the case of 10% As would employ nine layers of GaN, followed by a single layer of GaAs, etc.

Such materials can be used in a variety of applications. Semiconductor lasers and diodes can be created that emit light of frequencies that more than span the visible spectra, from infrared to ultraviolet. Conversely, photodetectors and solar detectors can be fashioned that utilize the wide range of available bandgaps to collect light of all colors. High temperature transistors, diode rectifiers and other electronic devices can also be produced using the high direct bandgap materials lattice matched to Si, SiC or GaP.

Thus, active layers of the direct bandgap material GaAsN, when used with cladding layers of GaN, AlGaN or AlGaAsN in a diode heterostructure, are prime candidates for optical emission which can be placed under biaxial compressive strain, a visible analog to the InGaAs strained layer technology currently employed in the AlGaAs material system for diode lasers or LED's. At a border between two of the semiconductor materials, a p-n junction is formed by doping the respective materials with p-type and n-type dopants. Introducing dopants, both acceptors, such as C, Mg, and Zn, and donors, such as Si, Se, or Ge, into the GaAsN can be used to fabricate p-type and n-type doping, respectively. A cubic crystal lattice provides for easy formation of cleaved mirror and waveguide structures that feedback the emitted light to cause laser amplification. The resulting devices can efficiently emit coherent light spanning the visible spectra, including the blue region.

BRIEF DESCRIPTION OF THE DRAWINGS

FIG. 1 is a graph of the bandgap and lattice constant of AlGaInAs cubic crystals superposed with the lattice constant of some common substrates.

FIG. 2 is a graph of the bandgap and lattice constant of AlGaInN wurtzite crystals superposed with the lattice constant of some common substrates.

FIG. 3 is a table of tetrahedral covalent radii of group III and group V elements used to estimate nearest neighbor bond lengths in the crystal lattices of materials of the present invention.

FIG. 4 is a graph of the cubic and wurtzite lattice constants of $GaAs_xN_{1-x}$ for various concentrations (x) of N superposed with the lattice constants of various substrates.

FIG. 5 is a graph of the cubic and wurtzite lattice constants of $InAs_xN_{1-x}$ for various concentrations (x) of N superposed with the lattice constants of various substrates.

FIG. 6 is a graph of the lowest direct bandgap of $GaAs_{1-x}N_x$ for various concentrations (x) of nitrogen.

FIG. 7 is a graph of the lowest direct bandgap of $InAs_{1-x}N_x$ for various concentrations (x) of nitrogen.

FIG. 8 is a diagram of a LP-MOCVD apparatus used for manufacturing materials and devices of the present invention.

FIG. 9 is a diagram of an MBE apparatus used for manufacturing materials and devices of the present invention.

FIG. 10 is a perspective view of a light emitting device of the present invention.

FIG. 11 is a cutaway perspective view of a light receiving device of the present invention.

FIG. 12 is a side view of an AlGaAsN heterostructure of the present invention matched to an SiC or $Al_2O_3$ substrate.

FIG. 13 is a side view of an AlGaInAsN heterostructure of the present invention matched to a ZnO substrate.

FIG. 14 is a side view of an LED with an active region made from material of the present invention sandwiched between SiC layers.

BEST MODE FOR CARRYING OUT THE INVENTION

With reference to FIG. 1, the lattice constants and bandgap of AlGaInAs semiconductor materials are plotted along with the lattice constants of several common substrate materials. The points 10, 12 and 14 represent the binary compounds AlAs, GaAs and InAs, respectively, while the lines connecting these points represent the various ternary compounds AlGaAs, AlInAs and GaInAs and the triangular region enclosed by those lines represent the quaternary compounds AlGaInAs with various proportions of Al, Ga and In. All of these materials have a native cubic zincblende crystal structure. AlAs has a large bandgap of about 2.2 eV and a cubic lattice constant of about 5.66 Å. However, the binary compound AlAs, represented by point 10, as well as the ternary and quaternary compounds with a large proportion of aluminum, in the region near point 10, are indirect bandgap materials. GaAs has a direct bandgap of about 1.4 eV and a cubic lattice constant of about 5.65 Å. Thus, AlAs and GaAs are structural isomorphs, allowing free substitution of aluminum and gallium in solid solution without any significant change in the lattice constant. InAs is also a direct bandgap material with a bandgap energy of about 0.4 eV, but with a substantially larger lattice constant of about 6.06 Å. The introduction of indium can be used to produce strain so as to alter the bond structure in a layer and its neighboring layers of a heterostructure, most notably affecting the heavy hole valence bond in a way that can reduce laser threshold and improve operating efficiency of a laser diode.

The lattice constants of several common substrates are also seen in FIG. 1. The dashed line 16 represents both silicon and GaP substrates. Silicon has a diamond-type (cubic) crystal structure with a lattice constant of about 5.43 Å, while GaP has a zincblende (also cubic) crystal structure with a lattice constant of about 5.45 Å. Both of these substrates have a smaller crystal lattice than AlAs and GaAs, with a lattice mismatch of about 4%. These substrates have been used to grow AlGaAsP layers (although such compounds are indirect bandgap materials for large proportions of either aluminum or phosphorus), but attempts to grow AlGaAs layers on silicon or GaP have generally been unsuccessful, with the mismatch-strain causing unacceptable defect concentrations in the resulting material. The dashed line 17 represents both germanium and GaAs. As noted previously, GaAs has a lattice constant of about 5.65 Å making it an ideal substrate for AlGaAs materials, as well as AlGaInP, AlGaAsP and InGaAs material layers. Germanium, like silicon, has a diamond-type structure, and also has a cubic lattice constant of about 5.66 Å, nearly identical to GaAs. The dashed line 18 represents InP. It has a zincblende structure with a lattice constant of about 5.87 Å and is commonly used as a substrate for long emission wavelength materials (with emissions longer than 1100 nm) with a large proportion of indium, such as InGaAs and InGaAsP. Due to its relatively large lattice, InP is considered to be a potential substrate only for the mid-IR and far-IR emitting $InAs_{1-x}N_x$ and $InSb_yAs_{1-x-y}N_x$ ($x \leq 0.05$) materials of the present invention, the other arsenide-nitride materials of the present invention having too small a lattice for an InP substrate.

FIG. 2 shows another plot corresponding to FIG. 1, but for AlGaInN semiconductor materials. These nitride materials have a native hexagonal wurtzite crystal structure, but can also be induced to grow in a metastable cubic zincblende crystal structure with a suitable choice of substrate material and growth surface. That is, growth of a zincblende structure is generally favored on the [001] surface of a cubic substrate, while the active wurtzite structure generally results from growth on the [0001] surface of a hexagonal substrate or on the [111] surface of a cubic substrate. In the case of rhombohedral $Al_2O_3$ (sapphire) substrates, growth of a wurtzite structure is favored when the basal plane surface is used, while growth of a zincblende structure is favored when the r-plane surface is used. The plot in FIG. 2 assumes wurtzite growth for these materials, and so the corresponding wurtzite lattice constants are used.

The points 20, 22 and 24 represent the binary compounds AlN, GaN and InN, respectively, while the lines connecting those points represent the various ternary compounds AlGaN, AlInN and GaInN and the triangular region enclosed by those lines represent the quaternary compounds AlGaInN with various proportions of Al, Ga and In. It can be seen that AlN has a very high bandgap of about 6.0 eV and a relatively small lattice constant of about 3.11 Å. GaN can be seen to have a lower bandgap of about 3.4 eV and a slightly larger lattice constant of about 3.19 Å. InN has a still lower bandgap of about 2.0 eV and a considerably larger lattice constant of about 3.53 Å.

Superposed on the plot of FIG. 2 are the lattice constants of some common substrates. The dashed line 26 represents α-SiC, which has a lattice constant of about 3.08 Å, less than the lattice constant of any AlGaInN compound. The lattice mismatch with this substrate is about 1% for AlN and about 3.5% for GaN, and so α-SiC is a useful substrate for growing AlGaN layers, but less suitable for most of the arsenide-nitride materials of the present invention, since the lattice mismatch becomes worse as arsenic is incorporated into the lattice. However, the substrate could be used in AlGaN heterostructures that include AlGaAsN or GaAsN strained quantum wells. The dashed line 27 represents α-ZnO. (SiC and ZnO have both wurtzite (α) and zincblende (β) forms, although the α-form is more common.) It can be seen that α-ZnO has a lattice constant of about 3.25 Å, which nearly matches GaN (with a mismatch of only 1.9%) and which corresponds to a wide range of AlGaInN compounds, as seen by the dashed line 27 intersecting the triangular region. α-ZnO is thus a promising substrate. Its use has been limited so far by the relatively poor quality of available ZnO crystals, but the quality is expected to improve. The dashed line 28 represents basal plane sapphire ($Al_2O_3$) substrates. The basal plane growing surface of the rhombohedral $Al_2O_3$ substrate has an equivalent wurtzite lattice constant of about 3.62 Å, which can be seen to be larger than any AlGaInN material. However, sapphire substrates are considered promising for the arsenide-nitride semiconductor compounds of the present invention, since the lattice size increases as arsenic is added.

Because the arsenide-nitride materials of the present invention can have either a zincblende structure or a wurtzite structure, with the zincblende structure being the native crystal phase for those compounds with arsenic as the majority element and nitrogen as a minority element at the group V lattice sites, and with the wurtzite structure being the native crystal phase for those compounds with nitrogen as the majority element and arsenic as a minority element at the group V lattice sites of the crystal, it is more convenient to use nearest neighbor bond length rather than lattice constant in order to select suitable substrate materials and to determine the approximate compositions of materials which substantially match the crystal lattice at the growing surface of the selected substrate.

For this purpose, the method of tetrahedral covalent bonding radii of Pauling is used to estimate the nearest neighbor bond length. This method is applicable for tetrahedrally bonded semiconductors with bonds of a primarily covalent nature, as is the case for the wurtzite and zincblende-type III–V compound semiconductors of the present invention, as well as diamond-type (cubic) group IV semiconductor substrates, such as silicon and germanium, and both wurtzite and zincblende-type II–VI and IV—IV compound semiconductor substrates, such as ZnO and SiC. The set of values used for this composition is given in FIG. 3 for the group III and group V elements in the materials of the present invention. For example, the approximate nearest neighbor bond lengths for GaN and GaAs are 1.96 Å and 2.44 Å, respectively, determined by adding the corresponding pair of radii obtained from FIG. 3.

The cubic zincblende ($a_c$) and hexagonal wurtzite ($a_h$) lattice constants are related to the bond length (1) by the relations: $a_c=4/3 \sqrt{3}$ 1 and $a_h=2/3 \sqrt{6}$ 1. A comparison of the estimated bond lengths derived from the table with the actual lattice constants for the various binary compounds shows that, although the method tends to underestimate the bond lengths and corresponding lattice constants for heavier compounds and tends to overestimate them for the lighter compounds, none of the estimated values differ by more than 3% from the actual values and most are within 1% of the actual values. In addition to the values calculable from the table in FIG. 3, the following substrates have equivalent bond lengths: diamond 1.54 Å, SiC 1.88 Å, ZnO 1.99 Å, basal plane sapphire 2.22 Å, ZnS 2.34 Å, Si 2.35 Å, Ge 2.45 Å and ZnSe 2.45 Å.

The bond lengths are used to calculate approximate compositions of materials that lattice match with a particular substrate. For example, using the previously estimated lengths for GaN and GaAs, and estimating the bond length for a GaP substrate as 2.36 Å, we find that a ternary composition of $GaAs_{0.83}N_{0.17}$ has a bond length of 0.17 (1.96 Å)+0.83 (2.44 Å)=2.36 Å, that substantially lattice matches with GaP. The calculated values may be confirmed by growing a sample of the determined material on the selector substrate, and then, using known techniques, measuring the actual lattice constants of the material. Any deviations from the estimated value can then be ascertained and used to make slight modifications to the approximate composition calculated by the bond length method.

FIGS. 4 and 5 provide graphic illustration of the lattice matching of $GaAs_{1-x}N_x$ and $InAs_{1-x}N_x$ to some common substrates for various concentrations (x) of nitrogen. As seen in FIG. 4, the lattice constant of $GaAs_{1-x}N_x$, shown by line 30, decreases as the nitrogen concentration increases, since nitrogen is a smaller element than arsenic. The cubic lattice constant for GaAs (x=0.0) is about 5.65 Å and the wurtzite lattice constant for GaN (x=1.0) is about 3.19 Å. The marked locations on the line 30 represent the lattice constants for various substrates, including Ge or GaAs 32, GaP 34, Si 36, $Al_2O_3$ 38, InN 40, and ZnO 42. The dashed line 44 represents the lattice constant for SiC, which can be seen to be smaller than any of the $GaAs_{1-x}N_x$ materials. The boxed areas represent the approximate nitrogen concentrations which are accessible by means of equilibrium growth techniques, such as MOCVD, namely $x \leq 0.05$ and $x \geq 0.90$, while the portion of the line 30 between the boxed regions represent the MOCVD immiscible region, approximately 0.05<x<0.90, which require a nonequilibrium growth technique, such as the atomic layer epitaxy technique described below. It can be seen that for low nitrogen concentrations ($x \leq 0.05$), GaAs is the ideal substrate, indicated by reference numeral 32 on the graph, while for very high nitrogen concentrations ($x \geq 0.90$), ZnO is a likely choice of substrate, indicated by reference numeral 42 on the graph, as is pure bulk GaN (x=1.0) and possibly even SiC (dashed line 44).

In FIG. 5, it can be seen that the lattice constant of $InAs_{1-x}N_x$, shown by line 50, also decreases as the nitrogen concentration (x) increases. The cubic lattice constant for InAs (x=0.0) is about 6.06 Å and the wurtzite lattice constant for InN (x=1.0) is about 3.53 Å. Again the marked locations on the line 50 represent the lattice constants for various substrates, including InAs 52, InP 56, ZnSe 58, Ge or GaAs 60, GaP 62, Si 64, $Al_2O_3$ 66 and InN 68. The dashed line 54 represents the lattice constant for GaSb, which can be seen to be larger than any of the $InAs_{1-x}N_x$ materials. Quaternary GaInAsN compounds would have lattice constants between those of $GaAs_{1-x}N_x$ of FIG. 4 and $InAs_{1-x}N_x$ of FIG. 5, and would allow InP or ZnSe to be used as substrate materials for low nitrogen concentrations ($x \leq 0.05$) in the MOCVD miscible region.

Further, the introduction of other group III and group V elements, including boron, aluminum, phosphorus and antimony, allows achieving a lattice match to silicon (with $AlxGa_{1-x}P_{0.852}As_{0.108}N_{0.04}$, for example) and other substrates without having to resort to atomic layer epitaxy, since the proportions of arsenic and nitrogen can then be made compatible with standard LP-MOCVD or atmospheric pressure MOCVD growth techniques. Note, for example, that the ternary compound $GaAs_{1-x}N_x$ requires about 20% nitrogen to lattice match to silicon, whereas with sufficient phosphorus incorporated into the compound, the match can be achieved with less than 5% nitrogen at the group V lattice sites. Further, as discussed below, the more modest levels of nitrogen ($x \leq 0.05$) or arsenic ($x \geq 0.90$) incorporation allowed by adding one or more of the elements boron, aluminum, indium, phosphorus and antimony to the basic $GaAs_{1-x}N_x$ compound to form the more general $B_m Al_n Ga_{1-m-n-p} In_p Sb_z As_{1-x-y-z} P_y N_x$ compound (where m, n, p, y and z can range from 0 to 1) reduces the amount of bandgap bowing that is seen in the arsenide-nitride semiconductor compounds, since the effect is most pronounced for nitrogen levels between 5 and 90%.

With reference to FIGS. 6 and 7, this bandgap bowing effect is clearly seen by graphing bandgap energy versus nitrogen concentration (x) for $GaAs_{1-x}N_x$ and $InAs_{1-x}N_x$, respectively. The direct bandgap energy for a semiconductor alloy $I_x II_{1-x}$ may be approximated by the quadratic relationship, $$E_{gap}=E_{gap,I}(1-x)+E_{gap,II}(x)-C_{I,II}(x)(1-x),$$

where $E_{gap,I}$ and $E_{gap,II}$ are the bandgaps of the constituent binary materials and $C_{I,II}$ is the bandgap bowing parameter. For the $Al_x Ga_{1-x} As$ system, the bowing parameter is negligible and can be ignored. This is also the case for many other III–V compound semiconductor materials. However, this is not the case for materials incorporating nitrogen as a constituent. In fact for the arsenide-nitride compounds, the experimental results obtained to date suggest that the bandgap bowing coefficient is sufficiently great that, instead of increasing as expected for negligible bowing, the lowest direct bandgap actually decreases as nitrogen is added. Based on the limited experimental data obtained to date and theoretical models, the bowing parameter for $GaAs_{1-x}N_x$ is estimated to be approximately 14 eV, while that for $InAs_{1-x}N_x$ is estimated to be about 11 eV.

The graphs in FIGS. 6 and 7 show the calculated bandgap energies for these material systems based on the estimates. The boxed areas 70 and 72 in FIG. 6 enclose those portions of the curve representing materials obtainable with growth techniques like MOCVD. The area 72 in particular ($x \geq 0.90$) shows that GaAsN materials with direct bandgaps greater than 2.0 eV are obtainable for light emission in the green, blue and near UV portions of the spectrum. Note that the model also predicts a closing of the bandgap in $GaAs_{1-x}N_x$ for 0.16<x<0.71. Materials with negative bandgaps are no longer semiconductors, but are metallic instead.

A similar reduction in bandgap occurs in $InAs_{1-x}N_x$ as x increases from 0. For InAs the bandgap is about 0.36 eV, but for $InAs_{0.99}N_{0.01}$ the bandgap is reduced to 0.27 eV. Likewise, for $In_{0.75}Ga_{0.25}As_{1-x}N_x$, the bandgap reduces from 0.62 eV (corresponding to 2.0 μm emission) for x=0 to 0.53 eV (corresponding to 2.34 μm emission) for x=0.01. Taking into account the fact that strain for such a quantum well layer will also be reduced when nitrogen is added (when using a GaAs or InP substrate), the increase in emission energy due to strain will be decreased, so the actual emission wavelength for the 1% N material will be longer (about 2.5 μm). These materials are useful for LIDAR systems, which require emission in the mid-IR region of the spectrum.

In all of these material systems GaAsN, InGaAsN and InAsN, the addition of aluminum to the composition is known to increase the bandgap energy. Likewise, the addition of phosphorus to the composition is known to increase the bandgap energy when arsenic is the dominant group V element. Either or both of these compositional variations can be used to create carrier confining heterostructures for more efficient light emission and cw laser operation.

Before providing examples of devices that can be created with these materials, a discussion of the process used for creating the materials is in order. Referring now to FIG. 8, a LP-MOCVD system that can be used to grow the III–V arsenide-nitride semiconductor compound materials of the present invention lattice matched to a selected substrate 120 is shown. The substrate 120 is disposed on a graphite susceptor 123 for heating although, as will be discussed below, the heating is less than is typical for LP-MOCVD, in order to encourage sufficient N concentration in the lattice matched material, and the pressure can range from 0.5 to $10^{-3}$ Torr. The substrate 120 and susceptor 123 are housed in a quartz reactor tube 125 which is ringed by a set of conductive coils 128. A radio frequency alternating current is adjustably applied to the coils 128 to produce heat in the susceptor 123, thereby heating the substrate 120 to a desired temperature. Connected to an outlet 130 of the tube 125 is a vacuum pump 132 which is used to evacuate the tube 125 of gases as is needed.

Organometallic compounds that are used to introduce the group III materials are contained in separate constant temperature baths. In a first constant temperature bath 133 is a bubbler of trimethylgallium (TMGa) 135 through which hydrogen gas from a hydrogen gas supply 138 is flowed, the flow controlled by a first flow regulator 140. As the hydrogen gas bubbles through the TMGa, the gas becomes saturated with the organometallic vapor, the gaseous concentrations at saturation determined by the temperature within the first bath 133. A conduit 142 controlled by a first shut-off valve 145 connects the TMGa bubbler 135 with the reactor tube 125. By controlling the temperature in the first bath 133 and the mass flow of hydrogen gas through the regulator 140, the mass flow of TMGa to the reactor tube 125 can be precisely controlled.

A second constant temperature bath 148 houses a bubbler of trimethylaluminum (TMAl) 150 which is supplied with hydrogen gas from the hydrogen gas supply 138 at a rate controlled by a second flow regulator 152. In combination with the temperature of the second bath 148, the flow of hydrogen gas through valve 152 controls the flow of TMAl that can be allowed by a second shut-off valve 155 through conduit 157 to enter reactor tube 125. Similarly, a third constant temperature bath 160 contains a bubbler of trimethylindium (TMIn) 162 which is provided with hydrogen gas at a rate controlled by a third flow regulator 165. Hydrogen gas saturated with TMIn can then be flowed to the reactor tube 125 via conduit 167, that flow switched on and off by a third shut-off valve 168. A fourth constant temperature bath 170 likewise contains a trimethylboron (TMB) bubbler 172 which has hydrogen gas supplied to it at a rate determined by a fourth regulator 175. Flow to the reactor tube 125 of hydrogen gas saturated with TMB is then provided by conduit 176, controlled by a fourth shut-off valve 177.

Alternative metal-organic compounds may be used for the column III pre-cursors. As an example, triethylgallium (TEGa) may be used in place of trimethylgallium (TMGa) as the gallium source. Similarly, alternative compounds exist for boron, aluminum and indium which may be used for the growth of these III–V compounds.

The group V components used for III–V crystal growth are supplied to the reaction tube 125 from separate containers. A first plenum 180 contains phosphine ($PH_3$) gas which can be supplied to the reactor tube 125 via conduit 182 at rate controlled by a fifth mass flow regulator 185. A second plenum 187 contains arsine ($AsH_3$) that can be flowed to the reactor tube 125 via conduit 190 at a rate controlled by a sixth flow regulator 192. Similarly, a third plenum 195 is filled with gaseous ammonia ($NH_3$) which can be flowed to reactor tube 125 via another conduit 197 at a rate controlled by a seventh regulator 200. $PH_3$ can be provided along with $NH_3$ to catalyze an $NH_3$ disassociation reaction, providing more free N for adsorption by the substrate 120. $AsH_3$ can similarly be used to catalyze $NH_3$. Both $PH_3$ and $AsH_3$ can be combined with $NH_3$ to cross catalyze an $NH_3$ disassociation reaction, providing a greater supply of free N. Alternatively, N can be supplied via third plenum 195 being provided with hydrazine ($H_2NNH_2$). Alternative sources may also be used for the column V elements, phosphorus, arsenic and antimony.

In addition to the above described bubblers and plenums that contain the aforementioned group III and group V elements, other bubblers and plenums, which have been left out for ease of illustration, may be provided in a given LP-MOCVD system, in order to provide inputs of other molecules. For example, it may be desirable to provide plenums containing silicon (Si), magnesium (Mg) or other elements for doping the crystal. On the other hand, not all of the above delineated bubblers and plenums may be needed for a given application.

In order to form a crystal having desired concentrations of elements using this LP-MOCVD system, gases are flowed into the reaction tube at precisely controlled rates and time periods. The rates and time periods can vary considerably due to variations in sticking coefficients of the type III elements being adsorbed and other factors. In some embodiments of the present invention, mixtures of gases containing type III atoms and gases containing type V atoms are flowed into the reaction tube 125 simultaneously to form III–V semiconductor crystal compounds on the substrate 120. In other embodiments of the present invention, gases containing group III atoms are flowed into the reaction tube 125 separately from gases containing type V atomic species, to form a semiconductor crystal from alternating single atomic layers of group III and type V on the substrate 120. The alternating growth of single layers of type III and type V atomic species requires that the surface of the substrate 120 upon which growth occurs has an off-axis orientation, such as [(111].

For the case of the quinternary system AlGaInAsN lattice matched to ZnO, as shown in FIG. 13, the actual growth of the material proceeds from a ZnO substrate 335. The initial buffer layer of AlGaN is grown at temperature between 500–900° C. Following the growth of the buffer layer, the reactor temperature is raised to the growth temperature between 750° C. and 1100° C. The constraints of growth temperature are (1) the growth temperature must be low enough to incorporate both In and As, and (2) the growth temperature must be high enough to allow the growth of high-quality crystal. The growth precursors are as previously mentioned. However, the relative ratio of As to N in the gas phase is adjusted to be N-rich so as to grow compounds with a majority of N of the Group V sublattice.

Following the growth of the initial buffer layer, a lower cladding layer comprising n-type $(Al_yGa_{1-y})_{0.81}In_{0.19}As_{0.10}N_{0.90}$ layer 336 is grown. The appropriate n-type dopants include Si, Ge, Sn, Se or Te. A layer 337 of nominally undoped $(Al_xGa_{1-x})_{0.81}In_{0.19}As_{0.10}N_{0.90}$ is grown next, followed by the $Ga_{0.75}In_{0.25}As_{0.1}N_{0.90}$ strained layer quantum well active region 338, followed by another layer 339 of nominally undoped $(Al_xGa_{1-x})_{0.81}In_{0.19}As_{0.10}N_{0.90}$ material. The p-type $(Al_zGa_{1-z})_{0.8}In_{0.19}As_{0.10}N_{0.90}$ upper cladding layer 340 is grown next, followed by a heavily doped $GaIn_{0.19}As_{0.10}N_{0.90}$ contact layer 341.

A molecular-beam epitaxy device for manufacturing semiconductor compounds of the present invention is shown in FIG. 9. A substrate 210 is attached to a molybdenum (Mo) block 212 used for heating the substrate 210. The block 212 is attached to a servo controlled pivot which can be rotated to face the substrate 210 in different directions within an ultrahigh vacuum chamber 215. Disposed at various angles around the substrate 210 and block 212 are sources of the group III and group V elements. The group V sources can be provided to the chamber 215 via gases such as $NH_3$ or $H_2NNH_2$, $PH_3$ and $AsH_3$ that have been disassociated in a manner similar to that discussed under LP-MOCVD. Alternatively, the type V elements can be produced in high pressure ovens for improved disassociation. An electron-cyclotron resonator, not shown, can be aligned with an $NH_3$ source to crack the $NH_3$ to yield a radical N source. The group V elements can be produced in independently heated effusion ovens which are enclosed in liquid nitrogen enclosed shrouds. The group III elements can be housed in similar effusion ovens. Group III–V compounds may also be provided in separate effusion ovens, for those applications in which it is desired to provide binary molecules to the substrate. The choice of the means for supplying elements and compounds to the chamber, including the geometric arrangement of the various sources of elements and compounds, depends upon the semiconductor material to be grown on the substrate 210.

An example of an arrangement for manufacturing a heterostructure laser of AlGaAsN is shown in FIG. 9. In this case the substrate 210 might be ZnO, for which AlGaAsN can be lattice matched provided that N atoms occupy approximately 92% of the group V lattice sites and As atoms occupy about 8% of the group V lattice sites. At a first angle of the chamber 215 is a GaN source 218 comprising a liquid nitrogen cooled effusion oven containing GaN. A GaN shutter 220 is closed, and the substrate 210 is facing away from the GaN source 218, indicating that GaN is not being grown on the substrate at this time. Adjacent to the GaN source 218 at a second angle is a GaAs source 222 comprising a liquid nitrogen cooled effusion oven containing GaAs. A pair of GaAs shutters 225 are open and the substrate is facing the GaAs 222 source, indicating that a thin layer of GaAs is being grown. Due to the ultra high vacuum maintained in the chamber, which may be $10^{-7}$ to $10^{-4}$ Torr, the GaAs emitted from the GaAs source 222 shoots out of the open shutters 225 as a molecular beam that impinges upon and sticks to the substrate and any monolayers already present on the substrate 210. Adjacent to the GaAs source 222 at a third angle is a AlN source 227 housed in a cooled effusion oven and shuttered by ALN shutters 230 which are shown closed. At a fourth angle, an AlAs source 233 is located, contained within AlAs shutters 235 that are closed. Adjacent to the AlAs source 233 at a fifth angle is a silicon (Si) source 237 which is similarly contained in an effusion oven cooled by liquid nitrogen. A Si shutter 240 is shown closed, restricting the Se from the substrate 210. The Si source 237 is provided for n-type doping of the III–V material, which can be accomplished by opening the Si shutters when one of the III–V layers is being grown and the substrate is facing somewhat away from the Se source 237. The concentration of Si being incorporated into the III–V material can be lowered to dopant levels by lowering the temperature of the Si effusion oven, so that less Si molecules are provided to the substrate 210. On the other side of the chamber 215 adjacent to the GaN source 218 is a magnesium (Mg) source 243 which can be used for incorporation of a p-type dopant into the III–V material. The Mg source 243 is shown separated from the chamber by a closed Mg shutter 245. The amount of Mg provided to the substrate 210 is kept at dopant levels by facing the substrate somewhat away from the Mg source 243 and by maintaining the Mg effusion oven at a lower temperature. Although Si and Mg are provided as dopants in the above example, other dopants can alternatively be used.

It is possible to obtain the correct concentration of N relative to As by a sequenced layering technique in which approximately one monolayer containing N is grown for every five containing As. In the examples which follow, atomic monolayers are described, where each monolayer is one layer of atoms on the order of 2.5 Å thick. However, this method can be generalized to include layers of increased thickness, i.e., more than one atomic layer thick, with the proviso that each individual layer be of a thickness less than the so-called critical thickness. The critical thickness is defined as the maximum layer thickness possible without introducing dislocations due to the strain from adjacent mismatched layers. In some material systems with a sequence of relatively closely matched crystal layers, the layer thicknesses can be as much as several hundred angstroms, while in more severely mismatched systems, such as GaAs/GaN layer sequences, the critical thickness is just a few atomic layers.

As an example, five monolayers of GaAs can be grown for every monolayer of GaN, resulting in an N concentration of approximately 17% and an As concentration of about 83%, which is known to lattice match with a GaP substrate. It is similarly possible to provide the relative concentrations of Al compared to Ga with such layering. Thus, for example, having two monolayers of Ga interspersed with four layers of Al results in a Ga concentration of approximately 33% and an Al concentration of approximately 67%. Having an increased concentration of Al relative to Ga generally raises the bandgap, however, for Ga concentrations below about 21% and Al concentrations above about 79% of the group V lattice sites, the lowest bandgap is indirect. Al also has a lower index of refraction than Ga, making a material having a high Al concentration favorable as a cladding material.

Thus a simple light emitting device 248 as shown in FIG. 10 can be formed on an n-type, ZnO substrate 210 as follows. Initially, an n-type cladding layer 250 made of $AlAs_{0.08}N_{0.92}$ can be grown to a thickness of about 0.2 μm. This layer can be formed by growing one monolayer of AlAs doped with Se, followed by eleven monolayers of AlN, upon which another monolayer of AlAs doped with Se is grown, etc. The pattern of growing a monolayer of Se doped AlAs followed by eleven monolayers of AlN is then repeated until a crystal lattice cladding layer 250 of the desired thickness is formed.

On top of the n-type cladding layer 250 an active layer 255 is grown. In order to grow a defect free active layer 255 the group V lattice sites are again proportioned such that As occupies about 8% of those sites and N occupies the remaining 92% or so. If desired, the active layer 255 can have a lattice constant that is slightly mismatched with that of the cladding layer 250. This mismatch, formed for example by the addition of indium or a reduction of nitrogen concentration, produces a strain between the layers 250 and 255 that can reduce the threshold current required for light emission. The active layer 255 also must have a lower direct than indirect bandgap to emit light, which requires that at least 21% of the group III lattice sites are occupied with Ga rather than Al. The active layer 255 also has dimensions of a quantum well, in this example having a thickness of about 240 angstroms. This active layer 255 can be formed by sequential growth of a monolayer of GaN, followed by growth of a two monolayers of AlN, followed by one monolayer of GaN, which is followed by two more monolayers of AlN, etc. This sequence is repeated to achieve the approximately 240 angstrom thick active layer.

On top of the active layer 255 is grown a ptype cladding layer of AlAsN 260. Once again, the active layer 255 and the p-type cladding layer 260 can have lattice constants that are closely matched or mismatched to produce strain between the layers 255 and 260. This layer is formed in much the same way as the n-type cladding layer 250, except that Mg is incorporated as a dopant rather than Se. The Mg may be supplied along with the GaN layer in order to enhance the sticking of N. The p-type cladding layer of AlAsN 260 is formed to a thickness of about 0.2 $\mu$m. Both the n-type cladding layer 250 and the p-type cladding layer 260 have lower indexes of refraction than the active layer 255, causing light that is generated in the active layer 255 to be reflected. Both the n-type cladding layer 250 and the p-type cladding layer 260 have higher bandgaps than the active layer 255, forming a potential well in the active layer 255 which encourages electron-hole recombination in the active layer 255.

Grown atop the p-type cladding layer 260 is a p-type contact layer of GaAsN 265. As before, the ratio of N to As is chosen at about eleven to one in order to lattice match this layer 265 with the previous layer 260. Again the Mg dopant can be incorporated along with a GaN monolayer to enhance sticking of the N. A surface 267 of p-type window 265 can be annealed in N so that N replaces As in a thin layer of a thickness of about 10–100 angstroms at that surface 267, forming a translucent window and a potential barrier against surface recombination.

Attached to the substrate 210 on a face opposite to the surface on which the n-type cladding layer 250 is grown is affixed a metallic contact 268 used for providing a negative voltage to the device 248. At an opposite end of the device 248, on top of the GaAsN window 265 is affixed an interdigitated metallic contact 270 that is used to provide a positive voltage to the device 248. The interdigitated contact 270 has spaces between metal strips that allow light to pass through the contact 270. Alternatively, a contact can be made with the GaAsN window 265 that conducts electricity and is translucent.

During use, the metallic contact 268 is provided with a negative voltage and the interdigitated contact is provided with a positive voltage, together causing electrons from the n-type substrate 210 and n-type cladding layer 250 to move into the active layer 255, and causes holes from the p-type cladding layer 260 and p-type window 265 to move into the active layer 255. In the active layer 255 the electrons and holes combine, encouraged by the potential well, and since the active layer is a direct bandgap material, light is emitted. This light is emitted through the interdigitated contact 270.

While the light emitting device 248 is described in terms of growth of AlGaAsN materials on a ZnO substrate 210, it should be realized that similar devices can be formed from the many other III–V compounds previously described by growth on any of the several substrates previously described. In addition, while the foregoing description has been limited for ease of description to a simple light emitting device 248, other light emitting devices employing multiple quantum wells, quarter wavelength layers for Bragg reflection, edge emitting laser bars and lasers or diodes that emit light through the substrate can all be created by means of the present invention. It is also possible to remove the substrate by selective etching after formation of the layers of III–V materials.

In the preceding example, the light emitting diode 248 was constructed for blue light emission. However, as previously described, this materials technology is useful for the fabrication of light-emitting devices for emission throughout the visible spectrum. Further, a multi-color light emitting diode may easily be fabricated by sequentially growing a series of light emitting diodes. If all of the materials on top of any given light emitting diode are translucent to the light emanating from that diode, then the emission from all of the light emitting diodes is visible, allowing monolithic multi-color operation. If all of the diodes are operated simultaneously, additive color synthesis is possible. In the following text, the operation of such a "stacked" structure useful for the detection of radiation is described.

FIG. 11 shows an optoelectronic apparatus 275 employing materials of the previous device 248 in a converse fashion, that of receiving photons and emitting electrons. On an n-type GaN substrate 278 is grown an n-type GaAsN layer 280. For short visible light detection, N atoms occupy at least 90% of the group V lattice sites, while As atoms occupy the remaining 10% or less of the group V sites. The n-type GaAsN layer 280 can be grown as described above in a series of monolayers or layers of minimal thickness in order to obtain the desired ratio of N to As, and the layer 280 can be doped with Si during GaAs monolayer growth to form the n-type doping. The Si doping is fairly heavy to cause the n-type GaAsN layer to be somewhat electrically conductive. On top of the n-type GaAsN layer a p-type GaAsN layer 283 is grown. This layer 283 is much the same as the previous layer 280 except that Mg is added to the material during GaN monolayer growth to cause p-type doping rather than Si being added for n-type doping. Both of these GaAsN layers 280 and 283 have a direct band gap of about 1.9 eV, corresponding to red or yellow light.

Atop the p-type GaAsN layer 283 is grown a lattice matched, zincblende, n-type $Al_xGa_{1-x}As_N$ layer 285 by methods described earlier. As before, the concentration of N atoms at group V lattice sites is chosen to be about 90% and the concentration of As atoms at those sites is chosen to be about 10% in order to lattice match to the previous layer 283. Al and Ga are structural isomorphs in an AlGaAsN crystal, with AlN having only a slightly smaller lattice constant than GaN. Grown on the n-type $Al_xGa_{1-x}AsN$ layer 285 is a p-type $Al_xGa_{1-x}AsN$ layer 287. The p-type doping is accomplished as described before with Mg. The concentration of Al is chosen to be about 30% and the concentration of Ga about 70% at group III lattice sites, to produce a direct bandgap corresponding to green light.

Atop the p-type $Al_xGa_{1-x}AsN$ layer 287 an n-type $Al_yGa_{1-y}AsN$ layer 290 having a greater concentration of Al corresponding to a higher direct bandgap, and lattice matched to the previous layer 287. The group III lattice sites of this layer 290 are about 60% Al and about 40% Ga, and the group V lattice sites are again about 10% As and 90% N, giving the layer 290 a bandgap corresponding to blue light. Grown on top of the n-type $Al_yGa_{1-y}AsN$ layer 290 is a p-type $Al_yGa_{1-y}AsN$ layer 293, which has similar concentrations of group III and V elements but is doped with Mg rather than Si of the n-type layer 290.

Affixed to the n-type GaAsN layer 280 is an electrically conductive first lead 295. The first lead wraps around the layer 280 to provide electrical contact around a perimeter of the layer 280. Similarly affixed to the p-type GaAsN layer is a second lead 297. The leads 295 and 297 are fed to a voltage or current meter 300 which can detect voltage differences and current between the leads 295 and 297. Another pair of leads 303 and 305 are similarly attached to n-type $Al_xGa_{1-x}AsN$ layer 285 and p-type $Al_xGa_{1-x}AsN$ layer 287, respectively, the pair of leads 303 and 305 also being connected to a second voltage or current meter 307. A third pair of leads 310 and 312 are affixed to the n-type $Al_yGa_{1-y}AsN$ layer 290 and p-type $Al_yGa_{1-y}AsN$ layer 293, respectively, the pair of leads being connected at opposite ends to a third voltage or current meter 315.

A photon 316 having an energy corresponding to blue light impinging upon a top surface 317 of the apparatus 275 will be absorbed within p-type layer 293 or n-type layer 290. The energy of the photon 316 will likely be absorbed by an electron moving from a valence band to a conduction band within either layer 290 or layer 293, which requires an energy at least that of the direct bandgap of the materials comprising layers 290 and 293. Those carriers generated within approximately an ambipolar diffusion length of the depletion region between layers 290 and 293 will lead to a measurable photocurrent or photovoltage, dependent upon the biasing of the device. Thus, a measuring apparatus attached to leads 310 and 312 will register a signal when blue light impinges upon layers 290 and 293.

At a p-n junction between layers 290 and 293, electrons flow from n-type layer 290 into p-type layer 293, reaching a lower energy state by occupying holes in the p-type layer. Similarly, holes flow from the p-type region 293 to the n-type region 290. This process continues until an equilibrium voltage builds up across the p-n junction that counterbalances the reduction in energy achieved by crossing the border. This voltage creates a diode across the p-n junction that allows electrical current to flow across the junction from the p-layer to the n-layer but not the reverse. Similar p-n junctions can be found at a junction between layers 285 and 287 and at a junction between layers 280 and 283. Reversely directed p-n junctions exist at a boundary connecting layers 290 and 287, and at a boundary connecting layers 283 and 285.

A second photon 320 impinging upon surface 317 has an energy corresponding to green light. The second photon 320 does not have sufficient energy to boost an electron from a conduction to a valence band in layer 290 or layer 293, and travels through those layers unabated. The resulting photon will likely be absorbed within the p-type layer 287 or the n-type layer 285 since its energy matches that needed to boost an electron from a filled valence band to a conduction band of layers 285 and 287. Photogenerated carriers that diffuse to the p-n junction depletion region lead to photocurrent. Measurable current flows through leads 303 and 305, being detected as current or voltage by meter 307, which acts as a green light detector.

A third photon 322 impinging upon surface 317 has an energy corresponding to red light and thus passes through layers 293, 290, 287, and 285. The third photon 322 is then absorbed in layer 280 or layer 283, leading to current flow through leads 295 and 297 through meter 300, where it is detected as voltage or current corresponding to red light.

Apparatus 275 has been limited for ease of illustration to three meters 300, 307 and 315 for detecting three frequencies of light. Expansion of light detection capabilities of such a system can be made by adding more p-n junctions between layers of materials having bandgaps that are stacked in increasing energy. Apparatus 275 has also been limited in this example to AlGaAsN compounds lattice matched to a GaN substrate. As discussed previously, many other arsenide-nitride compounds and several other substrates can be used to create other similar optoelectronic apparatuses. In addition, an apparatus similar to that described above can instead be made to receive light through the substrate, provided that the substrate is translucent, and that the bandgaps of the materials forming the p-n junctions are highest adjacent the substrate and lowest furthest from the substrate. Alternatively, the substrate can be removed by selective etching to allow light to enter this reversely stacked apparatus unobstructed. Apparatus 275 shows metal contacts for the leads 295, 297, 303, 305, 310 and 312 located on the top surfaces of the layers 280, 283, 285, 287, 290 and 293. Access to these surfaces is generally formed by etching through the various layers in a staircase or mesa arrangement so that contact with each of the layers can be made from the top of the structure.

Thus, optoelectronic apparatus 275 presents a photodetector capable of acquiring and differentiating light of frequencies spanning the visible spectrum. Such an apparatus 275 can also function as an efficient solar cell, as light of frequencies spanning the visible spectrum can be collected and converted to electricity. The high-bandgap lattice-matched materials system of the present invention can improve the performance of electronic devices which are required to operate at elevated temperatures. In particular, the high degree of crystallinity of these lattice-matched materials will lead to the improved performance of minority carrier devices, since the performance of minority carrier devices is substantially impaired in materials of inferior crystallinity. Thus, transistors and diode rectifiers required to operate at elevated temperatures will be enhanced by the materials technology described herein.

Other embodiments of the present invention can be formed by combining group III elements which may include Al, Ga, B and In with group V elements including at least N and As, and possibly other group V atomic species as well, to substantially lattice match, possibly under strain, with various monocrystalline substrates including GaN, GaAs, GaAsP, GaP, InP, InN, Si, Ge, SiC, ZnO, ZnSe, $Al_2O_3$ (basal-plane and r-plane sapphire) and diamond, using the crystal template provided by the substrate to epitaxially grow III–V semiconductor compounds. Due to the large number of possible combinations of the above III–V elements that can be lattice matched to the above substrates, and the various concentration ranges of the III–V elements that can be lattice matched to a given substrate, a wide variety of useful materials and devices can be fabricated. As an example, $GaP_{0.764}As_{0.196}N_{0.04}$ should be lattice matched to GaP and $Al_{1-x}Ga_xP_{0.764}As_{0.196}N_{0.04}$ should also be lattice matched to GaP, so that layers of these materials could be grown to form a laser or light emitting diode. In addition, $Ga_{1-w}In_wAs_{1-y}N_y$ can also be lattice matched to InP. For example, the mid-IR emitting $In_{0.53}Ga_{0.47}As$ material is lattice matched to InP and nitrogen incorporation of up to 5% decreases the lattice constant only slightly.

The inclusion of As, P, or Sb in a GaN active region is useful for decreasing the bandgap of the active region of a light-emitting device. The addition of As, P or Sb into the active region may also introduce strain into the active region, thus, the GaAsN, GaSbN or GaPN active region can be a coherently strained active region under biaxial compression. Note that unstrained layers may also be grown by a proper choice of substrate, grown layer compositions or a thin layer composition and thickness such layers being sufficiently thin so as to avoid defect generation.

FIG. 12 shows an embodiment of this system. An AlGaN heterostructure 326–332 is grown upon a sapphire (a=3.6 Å) or SiC (a=3.0865 Å) substrate 325, standard non-lattice-matched substrates currently used for nitride growth, with n- and p-type doping in the lower and upper cladding layers 327 and 331, respectively. Following an AlGaN buffer layer 326 and the n-type $Al_yGa_{1-y}N$ lower cladding layer 327 are $Al_xGa_{1-x}N$ layers 328 and 330 (y>x), in the center of which is placed a $GaAs_{0.1}N_{0.9}$ strained-layer quantum well active region 329. Subsequently, an $Al_zGa_{1-z}N$ p-type upper cladding layer 331 is grown (27 k). Finally, a p-type $GaAs_{0.1}N_{0.9}$ cap 332 is grown to provide a low-resistance ohmic contact. In this example, As has been substituted in the GaN active and capping layers, however, P or Sb also provides for compressive strain and a diminution of the bandgap of GaN, which also provides low contact resistance. Appropriate dopants in this system are Mg, Zn or C for the p-dopant and Si, Ge, Sn, Se or Te for the n-dopant.

The application of this effect to the growth of a lattice-matched structure 335–341 is shown in FIG. 13. Starting with the ZnO substrate 335 (a=3.25 Å), an n-type $(Al_yGa_{1-y})_{0.81}In_{0.19}As_{0.10}N_{0.90}$ lower cladding layer 336 is grown, followed by $(Al_xGa_{x-1})_{0.81}In_{0.19}As_{0.10}N_{0.90}$ layers 337 and 339 (y>x), in the center of which is placed a $Ga_{0.75}In_{0.25}As_{0.10}N_{0.90}$ strained layer quantum well active region 338. A p-type $(Al_zGa_{1-z})_{0.81}In_{0.19}As_{0.10}N_{0.90}$ upper cladding layer 340 is then grown, followed by a $Ga_{0.81}In_{0.19}As_{0.10}N_{0.90}$ contact layer 341. This example uses a lattice-matched active region 338. However, further increases of As, Sb, or P or the inclusion of In in the active region 338 can introduce strain into the active region. Appropriate dopants in this system are Mg, Zn or C for the p-dopant and Si, Ge, Sn, Se or Te for the n-dopant.

One final application of interest is the construction of an LED, shown in FIG. 14, formed by the growth in a SiC substrate 345 of an n-type SiC lower confining layer 347, a GaAsN, GaPN, or GaSbN active layer 348 and a p-type SiC upper confining layer 349. This LED has utility when the bandgap of the active region 348 is less than the bandgap of the SiC confining layers. The bandgap of SiC is approximately 2.8 eV, thus this LED configuration would have utility for photon emission less than 2.8 eV or, equivalently, wavelengths greater than 440 nm, allowing access to the entire range of visible emission. For example, the active layer 348 may be a $In_{0.2}Ga_{0.8}As_{0.1}N_{0.9}$ strained layer quantum well.

What is claimed is:

1. A method for forming a high bandgap semiconductor material comprising:
   providing a crystalline substrate,
   epitaxially growing on said substrate a compound semiconductor material having a crystal lattice with a lattice constant substantially matching that of said substrate, said material including at least one element from the group consisting of Al, B, Ga and In disposed at Group III lattice sites and a concentration of N atoms of at least 2% and a concentration of As atoms of at least 2% disposed at Group V lattice sites, the compound semiconductor material composed of $In_wAl_xGa_{1-x-w}As_{1-y-z}P_zN_y$, where $0 \leq w \leq 1.0, 0 \leq x \leq 1.0, 0.02 \leq y \leq 0.98, 0 \leq z \leq 0.96$ and $0.02 \leq 1-y-z \leq 0.98$.

2. The method of claim 1 wherein the compound semiconductor material forms a layer that is strained and is sufficiently thin to avoid defect formation.

3. The method of claim 1 wherein concentration of N to As in the compound semiconductor material is either about 5% or less or about 90% or more.

4. The method of claim 1 wherein levels of N ($\leq 0.05$) or As ($\geq 0.90$) permit an additional amount of one or more of B, Al, In or P to the compound semiconductor material reducing the bandgap bowing of the compound semiconductor material as compared to a compound semiconductor material comprising $GaAs_{1-x}N_x$.

5. The method of claim 1 wherein the substrate is selected from the group consisting of $Al_2O_3$, MgO, GaP, Si, GaAs, Ge, SiC, ZnSe, ZnO and diamond.

6. The method of claim 1 wherein the compound semiconductor material is a strained layer quantum well.

7. The method of claim 1 wherein said growing on said substrate a compound semiconductor material includes LP-MOCVD at a temperature of less than 600° C., thereby increasing the concentration of N atoms in said compound semiconductor material by lowering the desorption of N atoms during said growing.

8. The method of claim 1 wherein said growing on said substrate a compound semiconductor material includes MBE at a temperature of less than 600° C., thereby increasing the concentration of N atoms in said compound semiconductor material by lowering the desorption of N atoms during said growing.

9. The method of claim 1 wherein said growing on said substrate a compound semiconductor material includes forming a sequence of thin layers of semiconductor compounds having at least one element from the group consisting of Al, Ga and In disposed at group III lattice sites and one element from the group consisting of N, P, As and Sb disposed at group V lattice sites.

10. The method of claim 1 wherein the compound semiconductor material exhibits a bandgap bowing parameter allowing for different composition of the alloy with adjustment of the ratio of As to N in the deposit of the material.

11. The method of claim 1 wherein the compound semiconductor material is a semiconductor layer in a semiconductor device.

12. The method of claim 7 wherein said LP-MOCVD includes disposing a gas including molecules having $H_2NNH_2$ compounds adjacent to said substrate, such that N atoms are incorporated in said material in a concentration greater than 2%.

13. The method of claim 7 wherein said LP-MOCVD includes disposing a gas including organometallic molecules having N atoms adjacent to said substrate, such that N atoms are incorporated in said material in a concentration greater than 2%.

14. The method of claim 7 wherein said LP-MOCVD includes:
   providing gaseous $NH_3$,
   cracking said $NH_3$, including catalyzing gaseous $NH_3$ with gaseous $AsH_3$ and gaseous $PH_3$, thereby producing gaseous N atoms, and
   disposing said gaseous N atoms adjacent to said substrate, such that N and As atoms are each incorporated in said material in a concentration greater than 2%.

15. The method of claim 8 wherein said MBE includes:
   dissociating $NH_3$ gas with an electron cyclotron resonator to produce radical N atoms, and
   directing a beam having said radical N atoms toward said substrate.

16. The method of claim 9 wherein said substrate is GaP and most of said sequence of thin layers of semiconductor compounds includes one element from the group consisting of Al and Ga disposed at group III lattice sites, and also includes a ratio of fifteen layers having the element P for every four layers having the element As and every one layer having the element N disposed at group V lattice sites.

17. The method of claim 10 wherein said bandgap bowing parameter is approximated by the quadratic relationship, $$E_{gap} = E_{gap,I}(1-x) + E_{gap,II}(x) - C_{I,II}(x)(1-x),$$

where $E_{gap,I}$ and $E_{gap,II}$ are the bandgaps of the constituent binary materials and $C_{I,II}$ is the bandgap bowing parameter.

18. The method of claim 10 wherein said bandgap bowing parameter is in excess of 1 eV.

19. The method of claim 10 wherein said material exhibits a bandgap bowing parameter, adjusting the ratio of As to N in said alloy to reduce its direct bandgap resulting in higher electrical conductivity in the semiconductor alloy due to said bandgap bowing parameter.

20. The method of claim 11 wherein the semiconductor layer is an ohmic contact layer.

21. The method of claim 11 wherein the semiconductor device is a light emitting device.

22. The method of claim 11 wherein the semiconductor device is a laser.

23. The method of claim 11 wherein the semiconductor device has an emission wavelength within the infrared wavelength range.

24. The method of claim 11 wherein the semiconductor device has an emission wavelength greater than 440 nm.

25. The method of claim 11 wherein selection of the molecular factors, w, x, y and z, for the semiconductor layer as well as other layers in the device providing for different emission wavelengths within the lightwave spectrum from UV to IR wavelengths.

26. The method of claim 11 wherein the semiconductor layer is deposited employing atomic layer epitaxy.

27. The method of claim 26 wherein the substrate is selected from the group consisting of $Al_2O_3$, MgO, GaP, Si, GaAs, Ge, SiC, ZnSe, ZnO and diamond.

28. The method of claim 26 wherein the compound semiconductor material is lattice matched to a substrate due to strain.

29. A method of forming a high bandgap semiconductor material comprising:

providing a substrate selected from the group consisting of $Al_2O_3$, SiC, ZnO, and InN, and epitaxially growing on said substrate employing MOCVD in a reactor a compound semiconductor material with a Group V sublattice composed primarily of nitrogen with at least one other Group V constituent constituting a minority constituent of said sublattice, the improvement comprising providing a nitrogen vapor source for providing a nitrogen vapor into the reactor and catalyzing the nitrogen vapor by introducing at least one catalyst into the reactor with the nitrogen vapor to increase the cracking efficiency thereof.

30. The method of claim 29 wherein the catalyst is $PH_3$ or $AsH_3$.

31. (New) The method of claim 29 wherein the catalyst is a combination of $PH_3$ and $AsH_3$.

32. The method of claim 29 wherein the nitrogen source is $NH_3$.

33. The method of claim 32 comprising the step of providing an additional nitrogen source.

34. The method of claim 33 wherein the additional nitrogen source is $H_2NNH_2$ or organometallic molecules containing nitrogen atoms.

* * * * *